United States Patent
Kim et al.

(10) Patent No.: US 9,305,802 B2
(45) Date of Patent: Apr. 5, 2016

(54) METHODS OF FORMING SEMICONDUCTOR DEVICES USING HARD MASKS

(71) Applicant: Samsung Electronics Co., Ltd., Suwon-si (KR)

(72) Inventors: Dongchan Kim, Seoul (KR); Gyungjin Min, Seongnam-si (KR); Minjoon Park, Yongin-si (KR); Seunghoon Park, Daejeon (KR); KeunHee Bai, Suwon-si (KR); Kisoo Chang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/510,331

(22) Filed: Oct. 9, 2014

(65) Prior Publication Data

US 2015/0104947 A1    Apr. 16, 2015

(30) Foreign Application Priority Data

Oct. 10, 2013  (KR) .................. 10-2013-0120791

(51) Int. Cl.
  *H01L 21/31* (2006.01)
  *H01L 21/311* (2006.01)
  *H01L 21/3213* (2006.01)

(52) U.S. Cl.
  CPC .... *H01L 21/31111* (2013.01); *H01L 21/31122* (2013.01); *H01L 21/31133* (2013.01); *H01L 21/31138* (2013.01); *H01L 21/32139* (2013.01)

(58) Field of Classification Search
  None
  See application file for complete search history.

(56) References Cited

U.S. PATENT DOCUMENTS

| 6,750,127 | B1 * | 6/2004 | Chang | ................ H01L 21/0332 257/E21.035 |
| 6,936,539 | B2 | 8/2005 | Yin et al. | |
| 7,576,441 | B2 | 8/2009 | Yin et al. | |
| 7,582,535 | B2 | 9/2009 | Lee et al. | |
| 7,759,186 | B2 | 7/2010 | Imhoff et al. | |
| 7,803,715 | B1 * | 9/2010 | Haimson | ........... H01L 21/02115 257/E21.058 |

(Continued)

FOREIGN PATENT DOCUMENTS

| KR | 1020070004009 | 1/2007 |
| KR | 1020080098566 | 11/2008 |

(Continued)

OTHER PUBLICATIONS

Hyeon Mo Cho, "Materials for Nano Patterning in Semiconductor Fabrication: Organosilicon and High Carbon-Containing Materials for Spin Coating Hardmask" *Polymer Science and Technology*, vol. 20 (5), pp. 472-480, Oct. 2009.

(Continued)

*Primary Examiner* — Scott B Geyer

(74) *Attorney, Agent, or Firm* — Myers Bigel & Sibley, P.A.

(57) ABSTRACT

Methods of forming a semiconductor device are provided. The methods may include forming an insulating layer including silicon on a substrate and sequentially forming a first hard mask layer and a second hard mask layer on the substrate. The first hard mask layer may include carbon, and the second hard mask layer may include carbon and impurities. The first and second hard mask layers may expose at least a portion of the insulating layer. The methods may also include performing an etching process to selectively remove the second hard mask layer with respect to the insulating layer. A ratio of etch rates between the second hard mask layer and the insulating layer during the etching process may be in a range of about 100:1 to about 10,000:1.

20 Claims, 24 Drawing Sheets

(56) References Cited

U.S. PATENT DOCUMENTS

| | | |
|---|---|---|
| 8,288,292 B2 | 10/2012 | Antonelli et al. |
| 8,536,065 B2 | 9/2013 | Seamons et al. |
| 2002/0014695 A1* | 2/2002 | Hori ................... H01L 21/32139 257/750 |
| 2005/0287771 A1 | 12/2005 | Seamons et al. |
| 2008/0014761 A1 | 1/2008 | Bhatia et al. |
| 2008/0242037 A1 | 10/2008 | Sell et al. |
| 2008/0283813 A1 | 11/2008 | Jeong |
| 2009/0117744 A1 | 5/2009 | Lee et al. |
| 2009/0121353 A1* | 5/2009 | Ramappa .......... H01L 21/76808 257/751 |
| 2011/0195548 A1 | 8/2011 | Yeh et al. |
| 2011/0306207 A1* | 12/2011 | Raghavan ........... H01L 21/0206 438/669 |
| 2012/0083111 A1* | 4/2012 | Lim .................. H01L 21/32134 438/591 |
| 2012/0217576 A1 | 8/2012 | Yeo |
| 2012/0258261 A1 | 10/2012 | Reddy et al. |
| 2012/0276743 A1* | 11/2012 | Won ........................ C23C 16/26 438/694 |
| 2014/0213059 A1* | 7/2014 | Doan ................ H01L 21/31138 438/694 |
| 2014/0216498 A1* | 8/2014 | Lee ................... H01L 21/31116 134/1.1 |
| 2015/0004802 A1* | 1/2015 | Kim .................... H01L 21/0332 438/763 |
| 2015/0064914 A1* | 3/2015 | Kong ................ H01J 37/32082 438/696 |
| 2015/0194317 A1* | 7/2015 | Manna ................ H01L 21/3086 438/694 |
| 2015/0200109 A1* | 7/2015 | Kong ................ H01L 21/31144 438/703 |
| 2015/0318181 A1* | 11/2015 | Cantone ........... H01L 29/66795 438/702 |

FOREIGN PATENT DOCUMENTS

| | | |
|---|---|---|
| KR | 1020090044810 | 5/2009 |
| KR | 1020090125149 | 12/2009 |
| KR | 1020120098093 | 9/2012 |

OTHER PUBLICATIONS

Zhengjun Liu, "Aluminum oxide hard mask fabrication by focused ion beam implantation and we etching" Thesis submitted for examination for the degree of Master of Science in Technology from Aalto University, School of Electrical Engineering, 77 pages, Sep. 9, 2012.

* cited by examiner

METHODS OF FORMING SEMICONDUCTOR DEVICES USING HARD MASKS

CROSS-REFERENCE TO RELATED APPLICATION

This U.S. non-provisional patent application claims priority under 35 U.S.C. §119 to Korean Patent Application No. 10-2013-0120791, filed on Oct. 10, 2013, in the Korean Intellectual Property Office, the disclosure of which is hereby incorporated by reference in its entirety.

BACKGROUND

The present disclosure generally relates to the field of electronics, and more particularly to a semiconductor device.

Semiconductor devices may include logic circuit devices, flash memory devices, dynamic random access memory (DRAM) devices, magnetic random access memory (MRAM) devices, and phase change RAM (PRAM) devices. Semiconductor devices may be manufactured through unit processes including, for example, a deposition process, a photolithography process, an ion implantation process and an etching process. As design rules of semiconductor devices decrease, production yields and/or productivity of the semiconductor devices may decrease.

SUMMARY

A method for manufacturing a semiconductor device may include forming a first pattern and a second pattern on a substrate and forming a first hard mask layer and a second hard mask layer on the first pattern. The method may also include performing a first process on the second pattern that may be exposed by the first and second hard mask layers and removing the second hard mask layer by an etching process. A ratio of etch rates between the second hard mask layer and the second pattern during the etching process may be in a range of about 100:1 to about 10,000:1.

According to various embodiments, the first hard mask layer may include a carbon containing layer formed by a spin coating method.

In various embodiments, the second hard mask layer may include a carbon containing layer doped with impurities, and the first hard mask layer may be disposed between the substrate and the second hard mask layer.

In various embodiments, the impurities may include boron, gallium, phosphorus and/or arsenic.

According to various embodiments, the second hard mask layer may be an amorphous carbon layer formed by a chemical vapor deposition (CVD) process or an atomic layer deposition (ALD) process.

According to various embodiments, the etching process that is used to remove the second hard mask layer may be a wet etching process using an etching solution including sulfuric acid.

In various embodiments, the second pattern may include a spacer on the substrate, and the spacer may include silicon nitride.

According to various embodiments, the method may further include forming a third hard mask layer on the second hard mask layer. The third hard mask layer may include a material different from the second hard mask layer.

In various embodiments, the third hard mask layer may include silicon oxide.

According to various embodiments, the method may also include patterning the second hard mask layer using the third hard mask layer as an etch mask and removing the third hard mask layer by a wet etching process. The third hard mask layer may be removed using a LAL solution, and a ratio of etch rates between the third hard mask layer and the second hard mask layer during the wet etching process may be in a range of about 1:1 to about 100:1.

According to various embodiments, the method may additionally include removing the first hard mask layer by a wet etching process or an ashing process after removing the second hard mask layer.

A method for manufacturing a semiconductor device may include forming a first pattern and a second pattern on a substrate and sequentially forming a first hard mask layer and a second hard mask layer on the first pattern. Each of the first and second patterns may include a spacer. The method may also include performing a process on the second pattern that is exposed by the first hard mask layer and the second hard mask layer and removing the second hard mask layer by a wet etching process. A ratio of etch rates between the second hard mask layer and the second pattern during the wet etching process may be in a range of about 100:1 to about 10,000:1.

According to various embodiments, the spacer may include silicon nitride.

In various embodiments, the second hard mask layer may include an amorphous carbon layer doped with impurities, and the amorphous carbon layer may be formed by a chemical vapor deposition (CVD) method or an atomic layer deposition (ALD) method.

According to various embodiments, the wet etching process may use an etching solution including sulfuric acid.

A method of forming a semiconductor device may include forming an insulating layer including silicon on a substrate and sequentially forming a first hard mask layer and a second hard mask layer on the substrate. The first hard mask layer may include carbon, and the second hard mask layer may include carbon and impurities. The first and second hard mask layers may expose at least a portion of the insulating layer. The method may also include performing an etching process to selectively remove the second hard mask layer with respect to the insulating layer.

According to various embodiments, a ratio of etch rates between the second hard mask layer and the insulating layer during the etching process may be in a range of about 100:1 to about 10,000:1.

In various embodiments, the impurities in the second hard mask layer may include boron, gallium, phosphorus and/or arsenic.

In various embodiments, the second hard mask layer may be an amorphous carbon layer formed by a chemical vapor deposition (CVD) process or an atomic layer deposition (ALD) process.

In various embodiments, performing the etching process may include performing a wet etching process using an etchant including sulfuric acid.

According to various embodiments, the first hard mask layer may be a carbon containing layer formed by a spin coating process.

In various embodiments, the insulating layer may be a silicon nitride layer or a silicon oxynitride layer.

According to various embodiments, the method may further include performing an ion implantation process using the first and second hard mask layers as an ion implantation mask.

In various embodiments, the insulating layer may have a substantially equivalent thickness before and after performing the etching process.

DETAILED DESCRIPTION OF THE EMBODIMENTS

Figure 1:
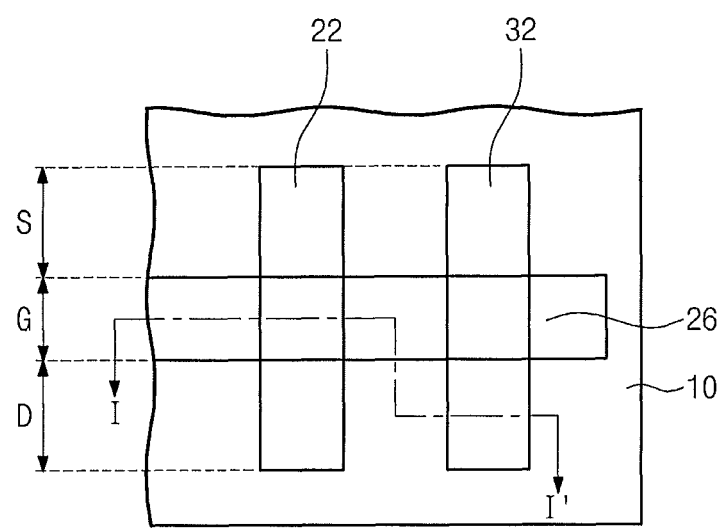
FIG. 1 is a plan view of a semiconductor device according to some embodiments of the present inventive concepts.

The present inventive concepts are described with reference to the accompanying drawings, in which example embodiments are shown. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element is referred to as being "coupled," "connected," or "responsive" to or "on" another element, it can be directly coupled, connected, or responsive to or on the other element, or intervening elements may also be present. In contrast, when an element is referred to as being "directly coupled," "directly connected" or "directly responsive" to or "directly on" another element, there are no intervening elements present.

It will be further understood that the terms "comprises," "comprising," "includes" and/or "including", when used in this specification, specify the presence of stated features, steps, operations, elements and/or components, but do not preclude the presence or addition of one or more other features, steps, operations, elements, components and/or groups thereof.

Example embodiments of the inventive concepts are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but may include deviations in shapes that result, for example, from manufacturing. For example, a region that is formed by an etching process may be illustrated as a rectangle but may have rounded or curved features.

It will be also understood that although the terms first, second, third etc. may be used herein to describe various elements, these elements should not be limited by these terms. These terms are only used to distinguish one element from another element. Thus, a first element in some embodiments could be termed a second element in some embodiments without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a plan view of a semiconductor device according to some embodiments of the present inventive concepts. Referring to FIG. 1, a semiconductor device may include a fin field effect transistor (fin-FET) or a metal-oxide-semiconductor (MOS) transistor. In some embodiments, the semiconductor device may include a first fin 22, a second fin 32, and a dummy gate electrode layer 26 on a substrate 10. The first fin 22 and the second fin 32 may extend in a first direction and may be spaced apart from each other in a second direction. The first direction may be different from the second direction. The dummy gate electrode layer 26 may extend in the second direction. Each of the first and second fins 22 and 32 may have a channel region G, a source region S, and a drain region D. The channel regions G of the first and second fins 22 and 32 may be disposed under the dummy gate electrode layer 26. The source region S and the drain region D of each of the first and second fins 22 and 32 may be disposed at sides of the dummy gate electrode layer 26. The source regions S and the drain regions D may be formed by performing a treating process (i.e., unit process) on the first and second fins 22 and 32. The treating process may include, for example, an ion implantation process or an etching process. The treating process performed on the first and second fins 22 and 32 will be described with reference to the following drawings.

Figure 2:
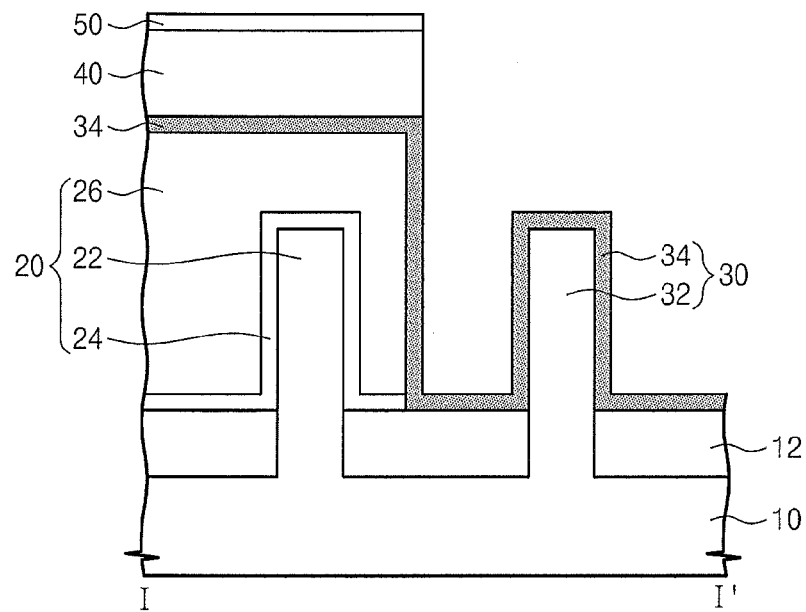
FIGS. 2 to 4 are cross-sectional views taken along the line I-I' of FIG. 1 illustrating intermediate structures provided in operations of forming a semiconductor device according to some embodiments of the present inventive concepts.
Figure 3:
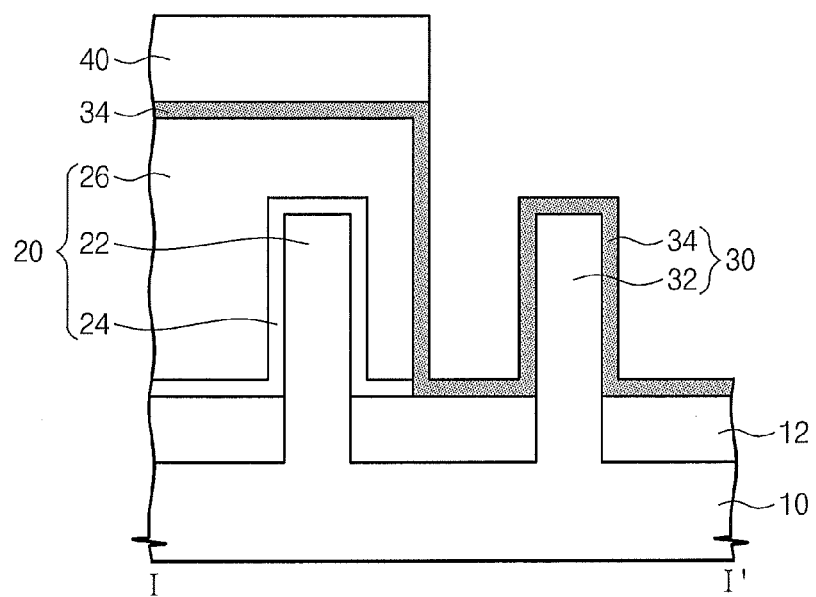
Figure 4:
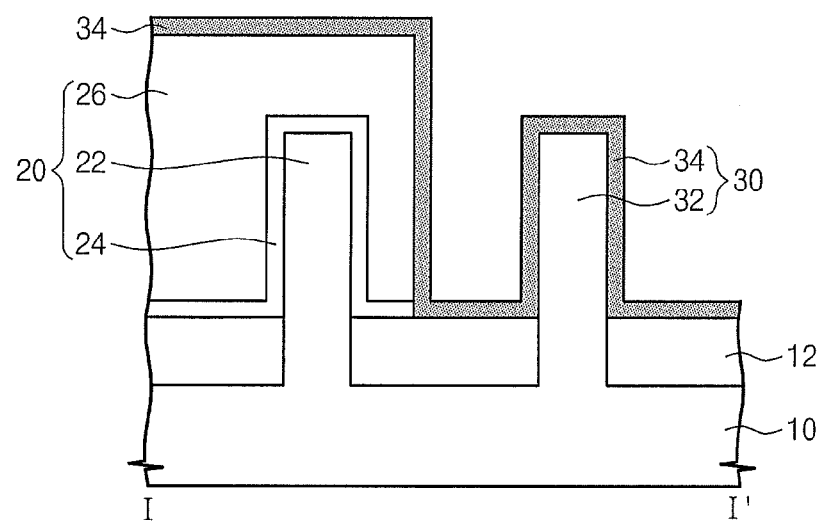

FIGS. 2 to 4 are cross-sectional views taken along the line I-I' of FIG. 1 illustrating intermediate structures provided in operations of forming a semiconductor device according to some embodiments of the present inventive concepts. Accordingly, FIGS. 2 to 4 illustrate a cross section of the channel region G of the first fin 22 and a cross section of the drain region D of the second fin 32.

Referring to FIGS. 1 and 2, a first hard mask layer 40 and a second hard mask layer 50 may be formed on a first pattern 20 disposed on the substrate 10. The first pattern 20 may be disposed on a first portion of the substrate 10 and a second pattern 30 may be disposed on a second portion of the substrate 10. The second pattern 30 may be spaced apart from the first pattern 20. The first hard mask layer 40 and the second hard mask layer 50 may expose the second pattern 30.

An insulating layer 12 may be formed on the substrate 10 and between the first pattern 20 and the second pattern 30. The first pattern 20 may include the first fin 22, a dummy gate insulating layer 24, the dummy gate electrode layer 26, and an offset spacer 34 disposed on the channel region G. The second pattern 30 may include the second fin 32 and the offset spacer 34 disposed on the drain region D. In some embodiments, the first fin 22 and the second fin 32 may protrude above a top surface of the substrate 10. The insulating layer 12 is on a top surface of the substrate 10. In some embodiments, the insulating layer 12 may cover the entire top surface of the substrate 10 except the first and second fins 22 and 32.

The dummy gate insulating layer 24 may include, for example, silicon oxide and/or silicon oxynitride. The dummy gate electrode layer 26 may include, for example, poly-silicon. The offset spacer 34 may cover the dummy gate electrode layer 26 that is disposed on the first portion of the substrate 10 and may cover the second fin 32 on the second portion of the substrate 10. In some embodiments, the offset spacer 34 may be a dielectric. For example, the offset spacer 34 may include silicon nitride and/or silicon oxynitride. However, the offset spacer 34 is not limited thereto. In some embodiments, the first fin 22 may be the drain region D, and the dummy gate insulating layer 24 and the dummy gate electrode layer 26 on the first pattern 20 may be a buffered passivation layer including silicon nitride and/or silicon oxide.

Forming the first hard mask layer 40 and the second hard mask layer 50 may include a dry etching process using a photoresist pattern as an etch mask. The dry etching process may use an etching gas including, for example, sulfuric acid, nitric acid, phosphoric acid, hydrofluoric acid, $CF_4$, and/or ammonium fluoride. The photoresist pattern may be removed after the first and second hard mask layers 40 and 50 are formed.

The first and second hard mask layers 40 and 50 may include a material having an etch selectivity with respect to the substrate 10, the first pattern 20 and the second pattern 30. For example, the substrate 10, the first pattern 20 and the second pattern 30 may include silicon-based materials, and the first and second hard mask layers 40 and 50 may include carbon containing materials having a high etch selectivity with respect to the silicon-based materials. In some embodiments, the first hard mask layer 40 may be a spin-on-hard mask (SOH) layer. For example, the first hard mask layer 40 may be a carbon layer formed by a spin coating method. It will be understood that the term "method" refers to process.

The second hard mask layer 50 may include an amorphous carbon layer formed by a chemical vapor deposition (CVD) method or an atomic layer deposition (ALD) method. In some embodiments, the second hard mask layer 50 may include impurities. Impurities may be included in the second hard mask layer 50 by performing a doping method. For example, the second hard mask layer 50 may include at least one of boron, gallium, phosphorus and arsenic. In some embodiments, the second hard mask layer 50 may be a boron-doped amorphous carbon layer (BACL). The amorphous carbon layer doped with the impurities may have a density higher than a density of a carbon layer formed by a spin coating method. Accordingly, the second hard mask layer 50 may be used as an etch mask when the first hard mask layer 40 is etched. The first hard mask layer 40 may be removed by a dry etching method, which may use an etching gas including $CF_4$, ammonium fluoride, and/or $SF_6$.

A first treating process may be performed using the second hard mask layer 50 and the first hard mask layer 40 as a mask. The first treating process may include, for example, an ion implantation process or an etching process. The ion implantation process is a doping process in which impurities are implanted into the second pattern 30 and an upper surface of the substrate 10. The etching process may partially or entirely etch a surface of the second pattern 30. The offset spacer 34 of the second pattern 30 may be used as an ion implantation buffer layer or a mask. In some embodiments, the offset spacer 34 may prevent or reduce implantation of the impurities into the substrate 10 under the second fin 32 during the ion implantation process. An ion implantation depth of the impurities in the second fin 32 may be inversely proportional to a thickness of the offset spacer 34. For example, when the offset spacer 34 has a thickness of about 26 Å (angstrom), the second fin 32 having a width of 100 nm (nanometer) or less and a height of 100 nm (nanometer) or less may be entirely implanted with the impurities.

Referring to FIG. 3, the second hard mask layer 50 may be selectively etched with respect to the second pattern 30. Stated in other words, the second hard mask layer 50 may be etched substantially without etching the second pattern 30. Variation in the thickness of the offset spacer 34, which may occur when the second hard mask layer 50 is etched, may cause defects during subsequent treating processes. For example, a subsequent treating process may include an ion implantation process using the offset spacer 34 as a buffer mask, and variation in the thickness of the offset spacer 34 may thus cause a variation in the depth of the impurities implanted by this process. Accordingly, etching the second hard mask layer 50 while reducing or eliminating damage on the offset spacer 34 may reduce defects.

According to some embodiments of the present inventive concepts, the second hard mask layer 50 may be etched by a wet etching process using an etching solution (i.e., etchant). In this case, an etch rate ratio of the second hard mask layer 50 to the offset spacer 34 may be in a range of about 100:1 to about 10,000:1 during the wet etching process. In some embodiments, the etch rate ratio of the second hard mask layer 50 to the offset spacer 34 may be in a range of about 1,000:1 to about 10,000:1 during the wet etching process. For example, the second hard mask layer 50 may be isotropically removed (i.e., etched) by a sulfuric acid solution. The wet etching process may etch the BACL at an etch rate of about 1240 Å/min. The wet etching process may etch a silicon nitride layer at an etch rate of about 0.2 Å/min. A TEOS silicon oxide may be etched at an etch rate of about 1.5 Å/min by the wet etching process. The offset spacer 34 formed of silicon nitride may not be damaged (i.e., etched) when the second hard mask layer 50 formed of BACL is removed. The first hard mask layer 40 may be partially removed during the wet etching process of the second hard mask layer 50. However, the present inventive concepts is not limited thereto. In some embodiments, the second hard mask layer 50 may be etched by a dry etching process using an etching gas, and an etch rate ratio of the second hard mask layer 50 to the offset spacer 34 may be in a range of about 100:1 to about 10,000:1. It will be understood that the term "etch rate ratio" refers to a ratio of etch rates.

Referring to FIG. 4, the first hard mask layer 40 may be removed. The first hard mask layer 40 may be removed by, for example, a wet etching method or an ashing process. The first hard mask layer 40 may be removed by the wet etching method using, for example, nitric acid, sulfuric acid or phosphoric acid as an etching solution. The ashing process may remove the first hard mask layer 40 using oxygen plasma. The offset spacer 34 of the second pattern 30 may be hardly damaged when the first hard mask layer 40 is removed and may remain on the substrate 10. The offset spacer 34 of the second pattern 30 may not be removed when the first hard mask layer 40 is removed. In some embodiments, at least one treating process may be performed on the second pattern 30 before the first hard mask layer 40 is removed. The treating process may be performed using the first hard mask layer 40 as a mask. The treating process may include, for example, an ion implantation process or an etching process. Since the offset spacer 34 of the second pattern 30 may be only minimally damaged when the second hard mask layer 50 is removed, reproducibility of subsequent treating processes performed on the second pattern may be increased or improved.

Referring again to FIG. 2, a first hard mask layer 40 and a second hard mask layer 50 may be formed again on the first pattern 20 and then a second treating process may be performed on the second pattern 30. The second treating process may include, for example, an ion implantation process or an etching process. The second treating process including an ion implantation process may be performed on the second pattern 30 using the offset spacer 34 as an ion implantation buffer layer. The second treating process including an ion implantation process may use the first hard mask layer 40 and the second hard mask layer 50 of FIG. 2 as an ion implantation mask. A logic circuit may include an overlapped ion implantation region or a double ion implantation region to provide various levels of resistance values, threshold voltage values or capacitance values. In some embodiments, the second pattern 30 may correspond to an overlapped implantation region.

Figure 5:
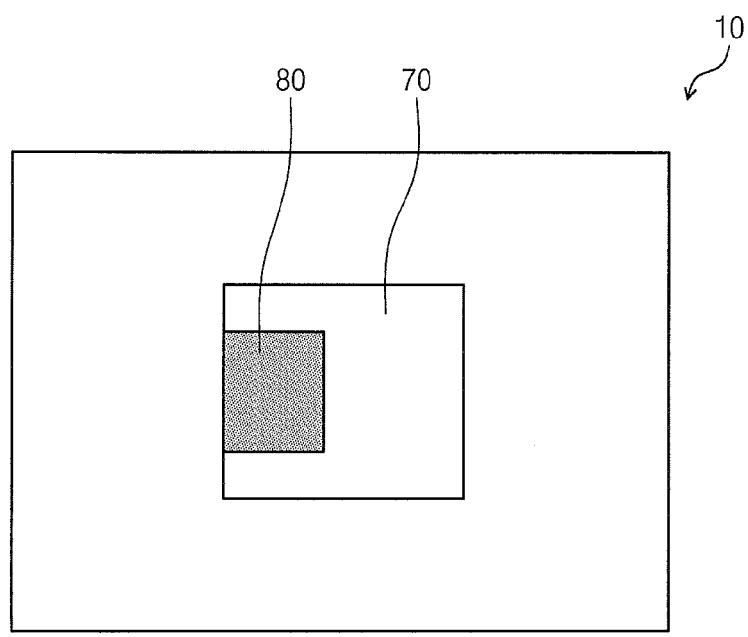
FIG. 5 is a plan view illustrating a semiconductor device according to some embodiments of the present inventive concepts.

FIG. 5 is a plan view illustrating a semiconductor device according to some embodiments of the present inventive concepts. Referring to FIGS. 2 and 5, the substrate 10 may include a first region 70 and a second region 80. The second region 80 may be in the first region 70 and may be a portion of the first region 70. Stated in other words, the first region 70 may include the second region 80. The first region 70, except the second region 80, may correspond to a single ion implantation region and the second region 80 may correspond to an overlapped ion implantation region. The first treating process may be performed on the first region 70 (including the second region 80.) The second treating process may be performed on the second region 80. The first hard mask layer 40 and the second hard mask layer 50 may be used as ion implantation masks or etch masks during the first and second treating processes. The first and second hard mask layers 40 and 50 may expose (i.e., may not cover) the first region 70 and the second region 80. The first and second hard mask layers 40 and 50 may be fondled on the substrate 10 before each of the first and second treating process is performed. For example, the first and second hard mask layers 40 and 50 may cover the substrate 10 except the first region 70 during the first treating process. The first and second hard mask layers 40 and 50 may cover the substrate 10 except the second region 80 during the second treating process. A portion of the first region 70 may be covered by the first and second hard mask layers 40 and 50 during the second treating process.

The second region 80 may overlap with the first region 70. The first and second regions 70 and 80 may be ion implantation regions including impurities. The first region 70 may be a single ion implantation region, and the second region 80 may be an overlapped ion implantation region. In some embodiments, the first pattern 20 may be disposed on the substrate 10 outside the first and second regions 70 and 80. The second pattern 30 may be disposed in the second region 80, an overlapped ion implantation region. Alternatively, the first pattern 20 may be disposed in the first region 70 outside the second region 80. Accordingly, the second pattern 30 may be exposed by the first and second hard mask layers 40 and 50 during the first and second treating processes.

The offset spacer 34 of the second pattern 30 may have an etch selectivity with respect to the second hard mask layer 50 when the second hard mask layer 50 is removed using an etching solution. Accordingly, the offset spacer 34 of the second pattern 30 may be hardly damaged when the second hard mask layer 50 is removed after the first treating process. The offset spacer 34 may substantially maintain its initial state (e.g., its thickness) when the second hard mask layer 50 is removed. The second treating process may be performed on the second pattern 30, which includes the offset spacer 34 that maintains its initial state. Thus, defects originating from the second treating process may be prevented or reduced.

The first and second hard mask layers 40 and 50 may be formed on the first pattern 20 or the second pattern 30 at least one more time. In some embodiments, the first and second hard mask layers 40 and 50 may be formed and removed several times.

Figure 6:
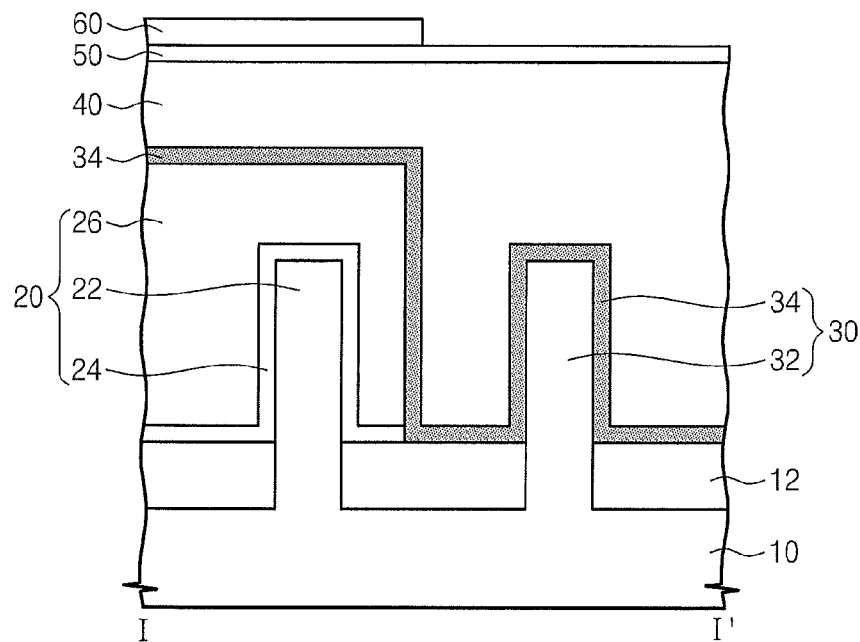
FIGS. 6 to 8 are cross-sectional views along the line I-I' of FIG. 1 illustrating intermediate structures provided in operations of forming a semiconductor device according to some embodiments of the present inventive concepts.
Figure 7:
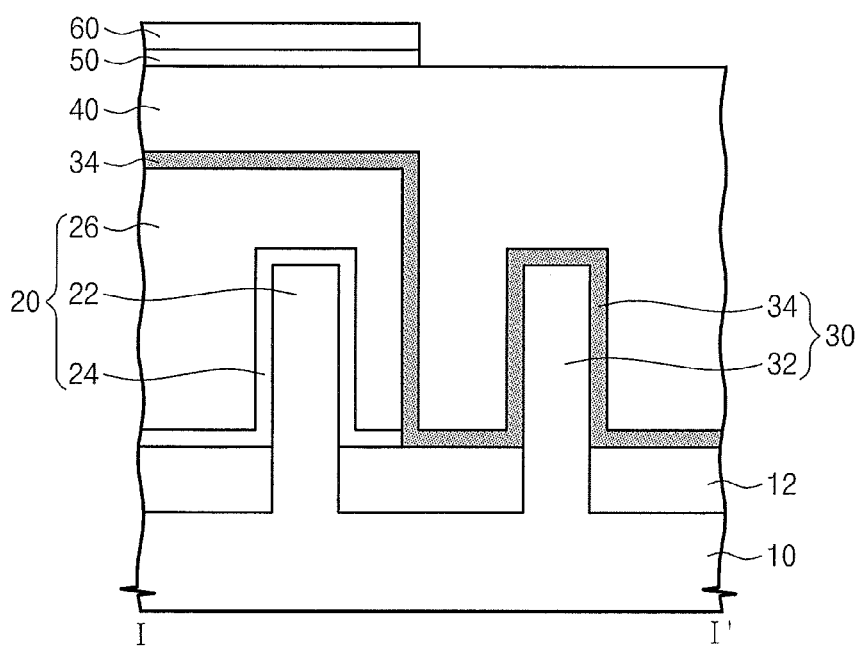
Figure 8:
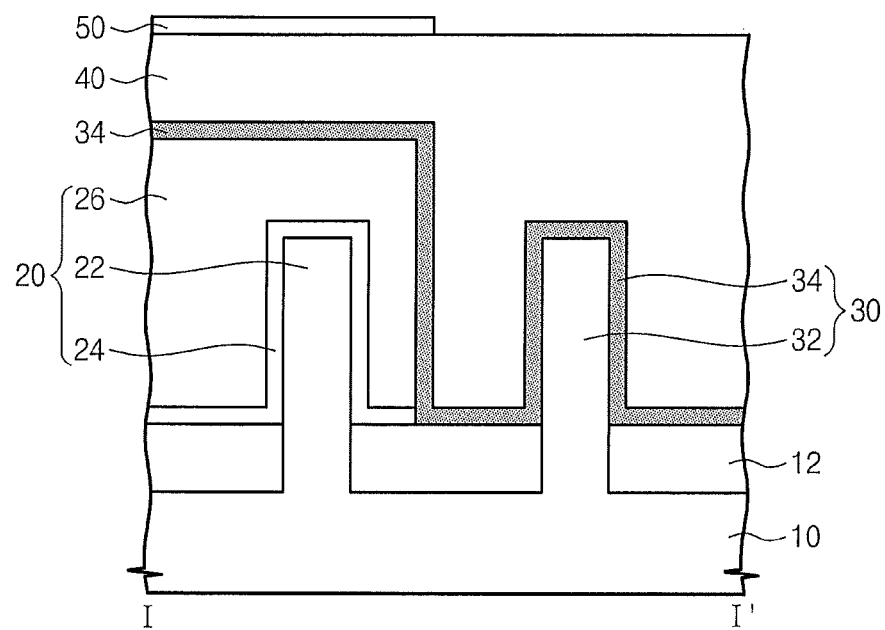

FIGS. 6 to 8 are cross-sectional views along the line I-I' of FIG. 1 illustrating intermediate structures provided in operations of forming a semiconductor device according to some embodiments of the present inventive concepts.

Referring to FIG. 6, a first hard mask layer 40 and a second hard mask layer 50 may be formed on a substrate 10 and then a third hard mask layer 60 may be formed on the first pattern 20. For example, the first hard mask layer 40 may include a carbon layer formed by a spin coating method. The second hard mask layer 50 may include a BACL formed by a CVD method or an ALD method. In some embodiments, the third hard mask layer 60 may include a dielectric different from the first and second hard mask layers 40 and 50. For example, the third hard mask layer 60 may include silicon oxide, silicon oxynitride and/or silicon nitride. Forming the third hard mask layer 60 may include a dry etching process using a photoresist pattern as an etch mask, and the dry etching process may use an etching gas including $SF_6$ or hydrofluoric acid (HF). The photoresist pattern may be removed after the third hard mask layer 60 is formed.

Referring to FIG. 7, the second hard mask layer 50 on the second pattern 30 may be removed. The second hard mask layer 50 may be removed by a dry etching process using the third hard mask layer 60 as an etch mask. The dry etching process etching the second hard mask layer 50 may use an etching gas that may include $CF_4$, ammonium fluoride ($NH_4F$), sulfuric acid, nitric acid, phosphoric acid, ethane ($C_2H_6$), and/or methane ($CH_4$). The second hard mask layer 50 may remain on and cover the hard mask layer 40 on the first pattern 20.

Referring to FIG. 8, the third hard mask layer 60 may be removed. In some embodiments, the third hard mask layer 60 may be removed by a wet etching process using an etching solution, and an etch rate ratio between the third hard mask layer 60 and the first hard mask layer 40 or an etch rate ratio between the third hard mask layer 60 and the second hard mask layer 50 may be about 1:1 to about 100:1. For example, the etching solution may include a LAL solution. The LAL solution includes a mixture of hydrofluoric acid (HF) and ammonium fluoride ($NH_4F$). The etch rate ratio between the third hard mask layer 60 and the first hard mask layer 40 or the etch rate ratio between the third hard mask layer 60 and the second hard mask layer 50 may be controlled by a ratio between the hydrofluoric acid and the ammonium fluoride of the LAL solution. The second hard mask layer 50 may be patterned using the third hard mask layer 60 as a mask, and then the third hard mask layer 60 may be removed.

Referring again to FIG. 2, the first hard mask layer 40 may be etched. The first hard mask layer 40 may be etched by a dry etching process using the second hard mask layer 50 as an etch mask. As described above, the dry etching process that is used to etch the first hard mask layer 40 may use an etching gas that may include carbon fluoride, ammonium fluoride, and/or $SF_6$. The second pattern 30 may be exposed by the second hard mask layer 50 and the first hard mask layer 40. The first hard mask layer 40 and the second hard mask layer 50 may cover the first pattern 20. The offset spacer 34 of the second pattern 30 may be exposed by the first hard mask layer 40 and the second hard mask layer 50.

A first treating process may be performed using the second hard mask layer 50 and the first hard mask layer 40 as a mask. In some embodiments, the first treating process may include, for example, an ion implantation process or an etching process. For example, the offset spacer 34 of the second pattern 30 may be used as an ion implantation buffer layer for the second fin 32 of the second pattern 30.

Referring again to FIG. 3, the second hard mask layer 50 may be selectively removed with respect to the second pattern 30. In some embodiments, the second hard mask layer 50 may be removed by a wet etching process using an etching solution that has an etch rate ratio between the second hard mask layer 50 and the offset spacer 34 about 100:1 to about 10,000:1. For example, the second hard mask layer 50 may be isotropically removed using a sulfuric acid solution. However, the present inventive concepts are not limited thereto. The offset spacer 34 may have a high etch selectivity with respect to the second hard mask layer 50. Thus, the offset spacer 34 may be hardly etched during the removal of the second hard mask layer 50. A thickness of the offset spacer 34 may be barely reduced.

Referring again to FIG. 4, the first hard mask layer 40 may be removed. The first hard mask layer 40 may be removed by, for example, a wet etching process or an ashing process using a plasma. The offset spacer 34 may not be damaged (i.e., etched) by an etching solution or the plasma and thus may remain on the substrate 10.

Referring again to FIG. 2, a first hard mask layer 40 and a second hard mask layer 50 exposing the second pattern 30 may be formed again and a second treating process may be performed on the second pattern 30 using the first and second hard mask layers 40 and 50 as masks. The second treating process may include, for example, an ion implantation process implanting impurities. The second pattern 30 may correspond to an overlapped ion implantation region on the substrate 10. A thickness of the offset spacer 34 of the second pattern 30 during the second treating process may be substantially same as a thickness of the offset spacer 34 of the second pattern 30 during the first treating process such that reproducibility of the subsequent treating processes performed on the second pattern 30 may be increased or improved.

FIGS. 9 to 28 are cross-sectional views illustrating intermediate structures provided in operations of forming a semiconductor device according to some embodiments of the present inventive concepts.

Figure 9:
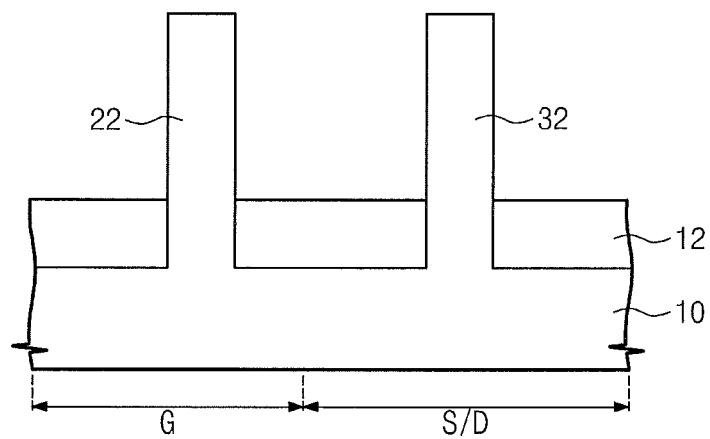
FIGS. 9 to 28 are cross-sectional views illustrating intermediate structures provided in operations of forming a semiconductor device according to some embodiments of the present inventive concepts.

Referring to FIG. 9, a first fin 22, a second fin 32 and an insulating layer 12 may be formed on a substrate 10. The first fin 22 and the second fin 32 may protrude from a top surface of the substrate 10. The first fin 22 and the second fin 32 may be formed by, for example, a photolithography process and an etching process. The insulating layer 12 may be formed by, for example, a thin layer deposition process and an etch-back process. In some embodiments, each of the first fin 22 and the second fin 32 may include a source region, a channel region and a drain region of a fin field effect transistor. In FIG. 9, the substrate 10 including the first fin 22 illustrates a channel region G and the substrate 10 including the second fin 32 illustrates a source/drain region S/D. Processes performed on the channel region G of the first fin 22 may be the same as or different from processes performed on the channel region of the second fin 32. Processes performed on the source/drain region S/D of the second fin 32 may be the same as or different from processes performed on the source/drain region of the first fin 22.

Figure 10:
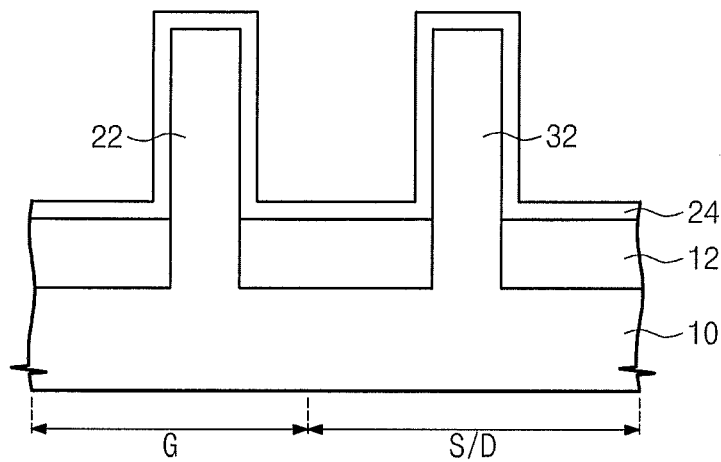

Referring to FIG. 10, a dummy gate insulating layer 24 may be formed on a top surface of the substrate 10. In some embodiments, the dummy gate insulating layer 24 may be formed on the entire top surface of the substrate 10. For example, the dummy gate insulating layer 24 may include silicon oxide and may be formed by a rapid thermal process (RTP) or a CVD method. The dummy gate insulating layer 24 may be formed on sidewalls and top surfaces of the first and second fins 22 and 32.

Figure 11:
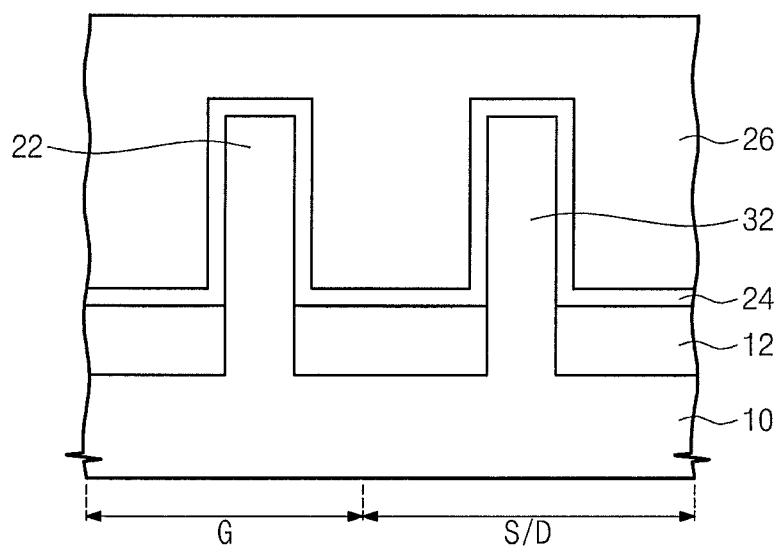

Referring to FIG. 11, a dummy gate electrode layer 26 may be formed on the dummy gate insulating layer 24. The dummy gate electrode layer 26 may include, for example, poly-silicon, which may be formed by a CVD method.

Figure 12:
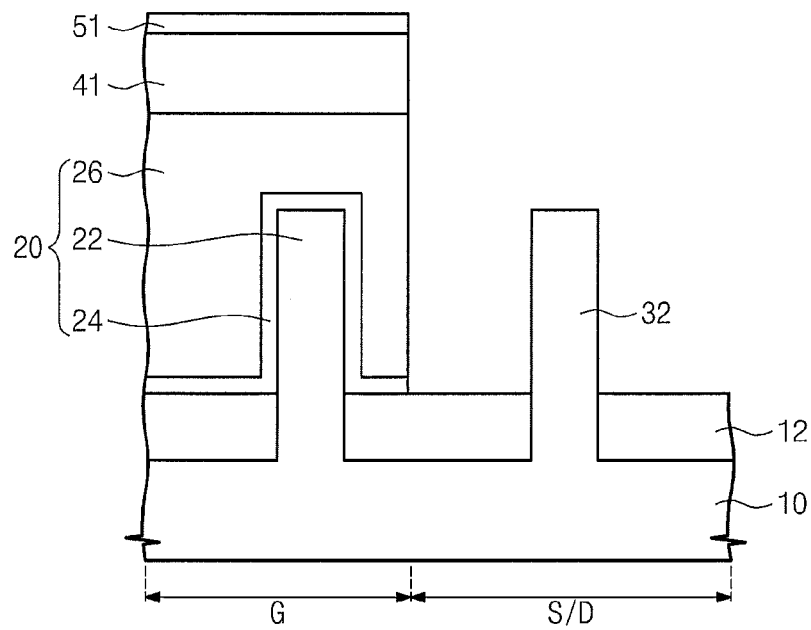

Referring to FIG. 12, a first hard mask layer 41 and a second hard mask layer 51 may be formed on the dummy gate electrode layer 26 on the channel region G, and the dummy gate electrode layer 26 formed on the source/drain region S/D may be removed. For example, the first hard mask layer 41 may include a carbon layer, which may be formed by a spin coating method. The second hard mask layer 51 may include, for example, a BACL. The first hard mask layer 41 and the second hard mask layer 51 may be formed on the channel region G by a photolithography process and an etching process. The etching process used for forming the first hard mask layer 41 and the second hard mask layer 51 may use sulfuric acid, nitric acid, phosphoric acid, hydrofluoric acid (HF), $SF_6$, $CF_4$, perfluorocarbons (PFCs), ammonium fluoride and/or hydrofluorocarbons (HCFs) as an etching gas.

An etching process may be performed to etch the dummy gate electrode layer 26 on the source/drain region S/D. The etching process may be a dry etching process using the first hard mask layer 41 and the second hard mask layer 51 as an etch mask. The dummy gate electrode layer 26 may be etched using $CF_4$. According to FIG. 12, the first hard mask layer 41, the second hard mask layer 51 and the dummy gate electrode layer 26 may remain on the channel region G of the first fin 22. The first hard mask layer 41, the second hard mask layer 51 and the dummy gate electrode layer 26 may also remain on the channel region of the second fin 32. The first hard mask layer 41 and the second hard mask layer 51 may be removed after the dummy gate electrode layer 26 is etched. The second hard mask layer 51 may be removed using, for example, a sulfuric acid solution. The second fin 32 may be formed of crystalline silicon and may thus have an etch selectivity with respect to the second hard mask layer 51 during the etching process using a sulfuric acid solution. The first hard mask layer 41 may be removed by, for example, an ashing process or a wet etching method.

Figure 13:
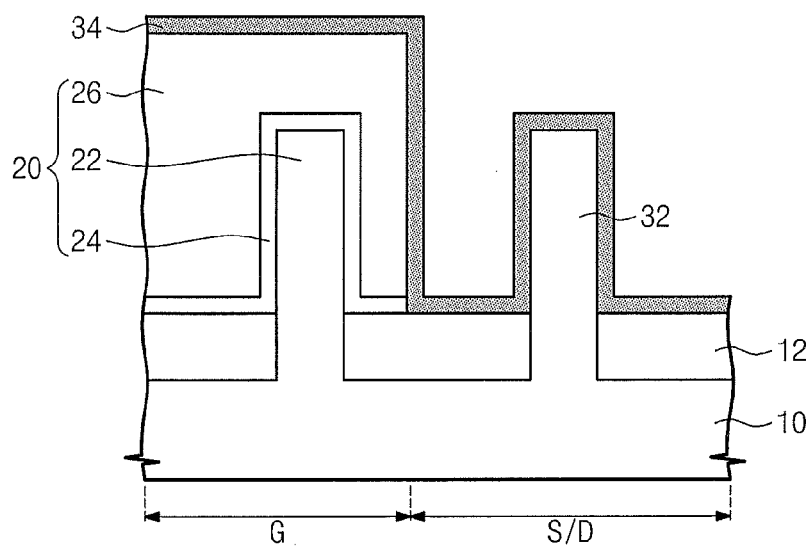

Referring to FIG. 13, an offset spacer 34 may be formed on a top surface of the substrate 10. In some embodiments, the offset spacer 34 may be formed on the entire top surface of the substrate 10. The offset spacer 34 may include, for example, silicon nitride or silicon oxynitride and may be formed by a CVD method or an ALD method.

Figure 14:
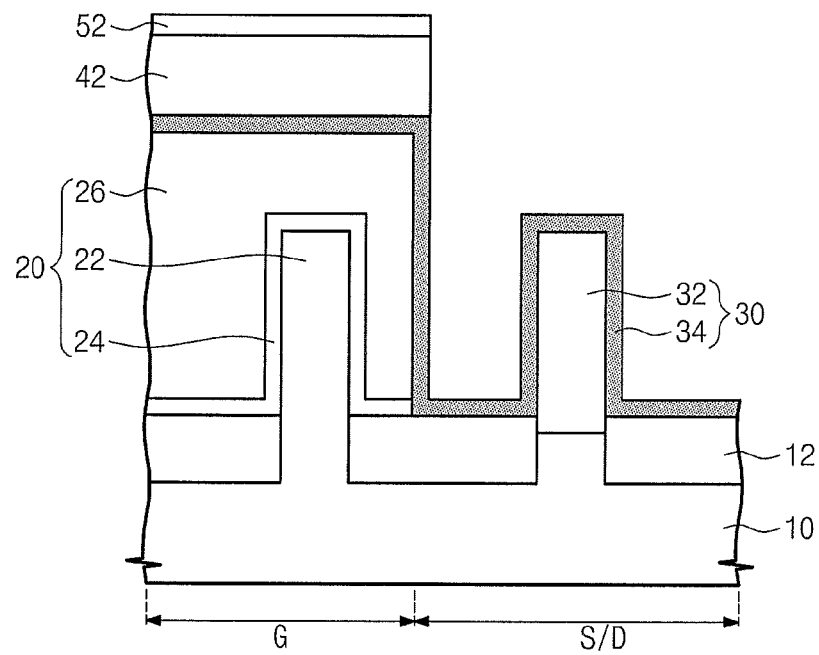

Referring to FIG. 14, a first hard mask layer 42 and a second hard mask layer 52 may be formed on the offset spacer 34 on the channel region G. Forming the first hard mask layer 42 and the second hard mask layer 52 may include thin layer formation processes (i.e., deposition processes), a photolithography process and/or an etching process. The first hard mask layer 42 may include, for example, a carbon layer and may be formed by a spin coating method. The second hard mask layer 42 may include, for example, a BACL.

Figure 15:
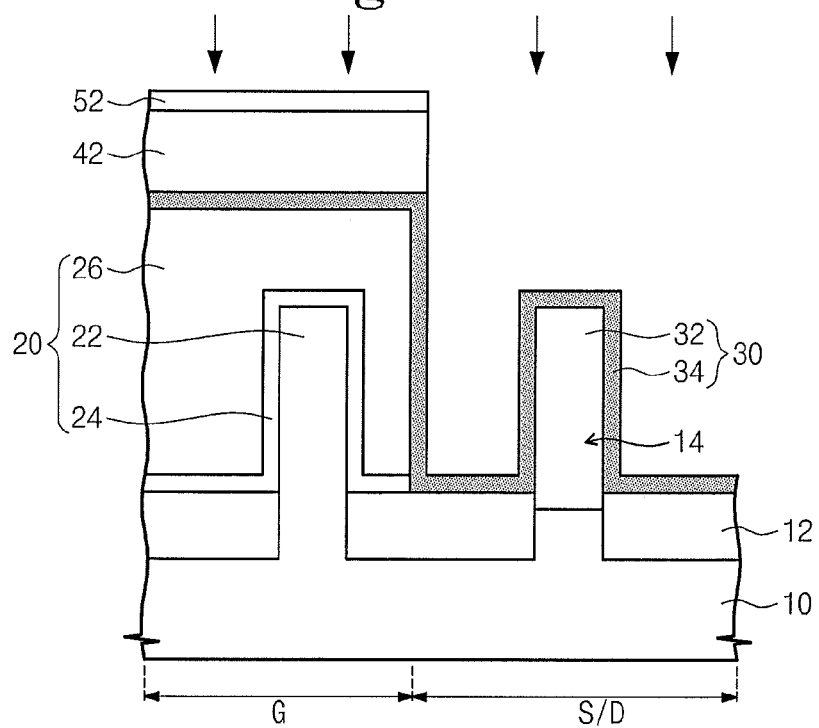

Referring to FIG. 15, a lightly doped drain (LDD) region 14 may be formed in the source/drain region S/D of the second fin 32. Forming the LDD region 14 may include, for example, an ion implantation process that implants impurities through the offset spacer 34 into the second fin 32. The first hard mask layer 42 and the second hard mask layer 52 may be used as an ion implantation mask when the LDD region 14 is formed.

Figure 16:
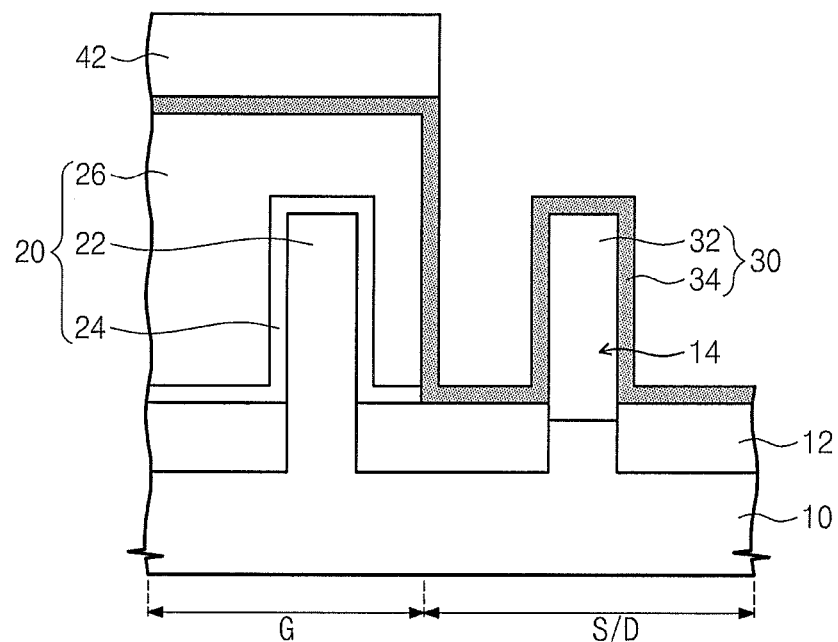

Referring to FIG. 16, the second hard mask layer 52 may be removed. In some embodiments, the second hard mask layer 52 may be removed by, for example, a wet etching method using a sulfuric acid solution as an etching solution. The offset spacer 34 may have an etching resistance with respect to the wet etching process using a sulfuric acid solution. For example, an etch rate ratio between the second hard mask layer 52 and the offset spacer 34 may be in a range of about 100:1 to about 10,000:1. Thus, the offset spacer 34 may remain on the second fin 32 substantially without variations in its thickness.

Figure 17:
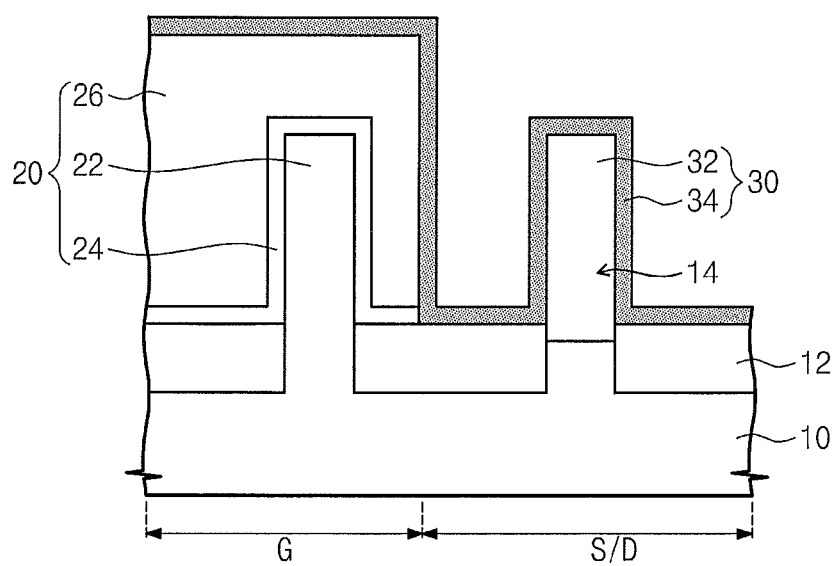

Referring to FIG. 17, the first hard mask layer 42 may be removed. The first hard mask layer 42 may be removed by, for example, an ashing process or a wet etching method. While not shown in the figures, the LDD region 14 may also be formed in the first fin 22 as well as in the second fin 32 during the ion implantation process used to form the LDD in the second fin 32. The LDD region 14 may be formed in other regions of the substrate 10. The second pattern 30 may correspond to an overlapped ion implantation region.

The processes described above with reference to FIGS. 14 and 15 may be performed again to implant impurities into the second fin 32 of the second pattern 30 such that the second pattern 30 may be an overlapped ion implantation region. In other words, another hard mask layer 42 and another hard mask layer 52 may be formed on the offset spacer 34 on the channel region G, and these hard mask layers may then be used as an ion implantation mask during an ion implantation process that implants impurities into the second fin 32. The offset spacer 34 may be used as an ion implantation buffer layer to improve reproducibility of processes of forming the overlapped ion implantation region. Thus, methods of forming a semiconductor device according to some embodiments may increase production yields. The first hard mask layer 42 and the second hard mask layer 52 may be sequentially removed after the overlapped ion implantation region is formed in the manner discussed above.

Figure 18:
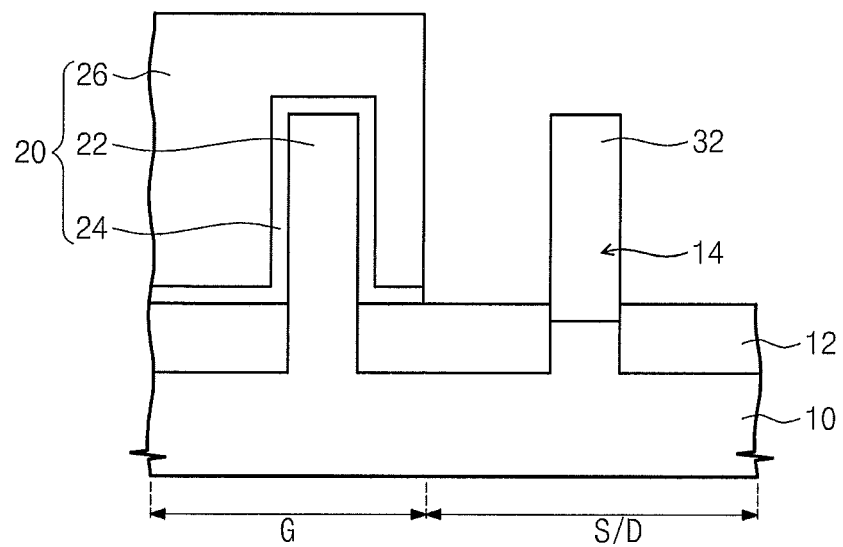

Referring to FIG. 18, the offset spacer 34 may be removed. The offset spacer 34 may be removed by, for example, a dry etching method or a wet etching method.

Figure 19:
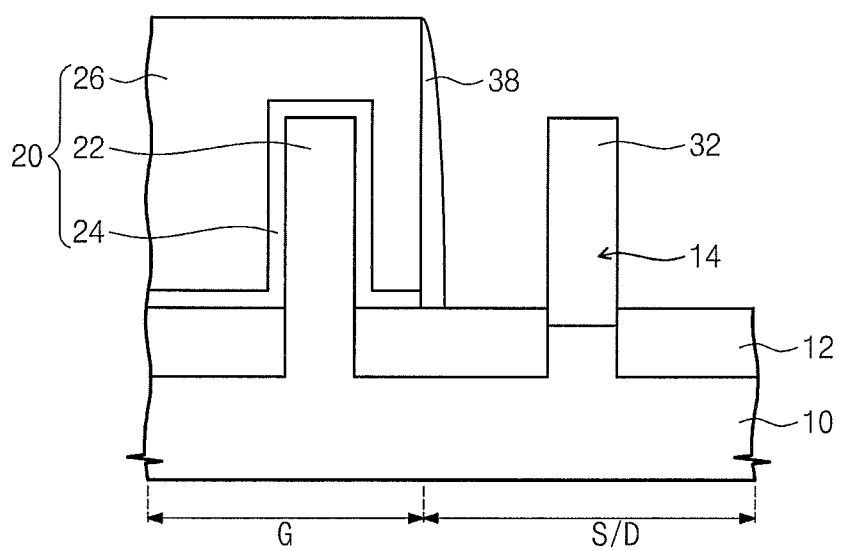

Referring to FIG. 19, a self-aligned spacer 38 may be formed on sidewalls of the dummy gate insulating layer 24 and the dummy gate electrode layer 26. The self-aligned spacer 38 may include, for example, silicon oxynitride or silicon nitride, which may be formed by a deposition process and an etching process. The etching process used for forming the self-aligned spacer 38 may include an anisotropic dry etching process. For example, the anisotropic dry etching process may use an etching gas including $SF_6$, $CF_4$, methane ($CH_3$), sulfuric acid ($H_2SO_4$), or any mixture thereof. The self-aligned spacer 38 formed on a sidewall of the source/drain region S/D of the second fin 32 of may be removed. Removing the self-aligned spacer 38 may include, for example, a photolithography process and an etching process.

Figure 20:
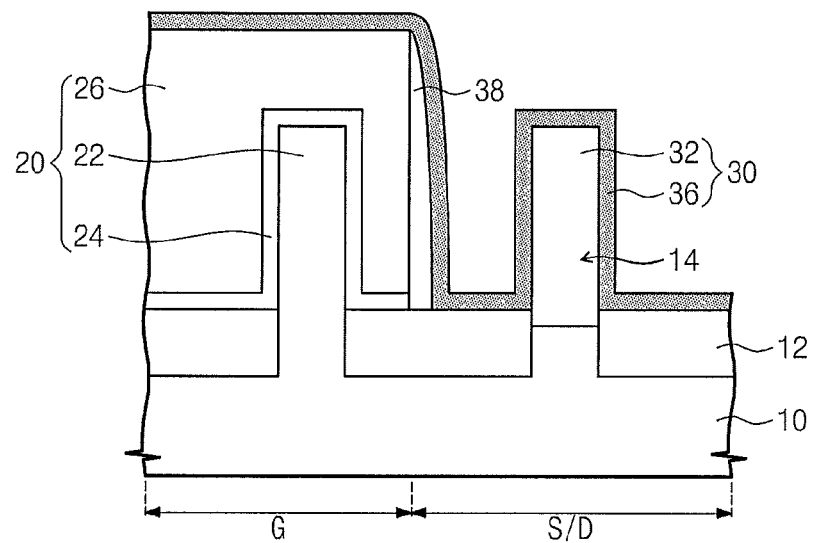

Referring to FIG. 20, an offset spacer 36 may be formed on a top surface of the substrate 10. In some embodiments, the offset spacer 36 may be formed on the entire top surface of the substrate 10. The offset spacer 36 may include, for example, silicon nitride or silicon oxynitride and may be formed by a CVD method. The offset spacer 36 may be formed of a material different from the self-aligned spacer 38. For example, the self-aligned spacer 38 may be formed of silicon nitride, and the offset spacer 36 may be formed of silicon oxynitride. In some embodiments, the self-aligned spacer 38 may be formed of silicon oxynitride, and the offset spacer 36 may be formed of silicon nitride.

Figure 21:
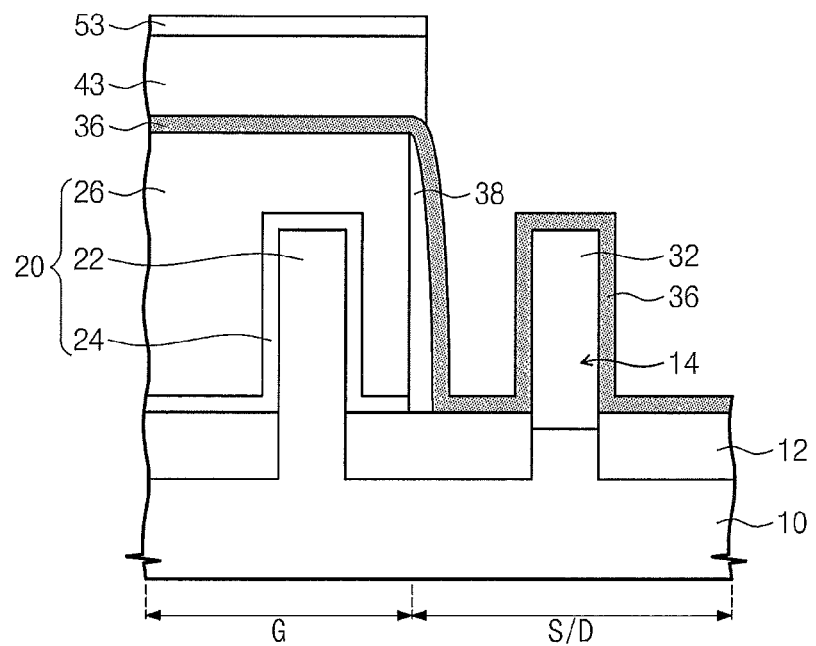

Referring to FIG. 21, a first hard mask layer 43 and a second hard mask layer 53 may be formed on the offset spacer 36 in the channel region G. The first hard mask layer 43 may include, for example, a carbon layer formed by a spin coating method. The second hard mask layer 53 may include, for example, a BACL.

Figure 22:
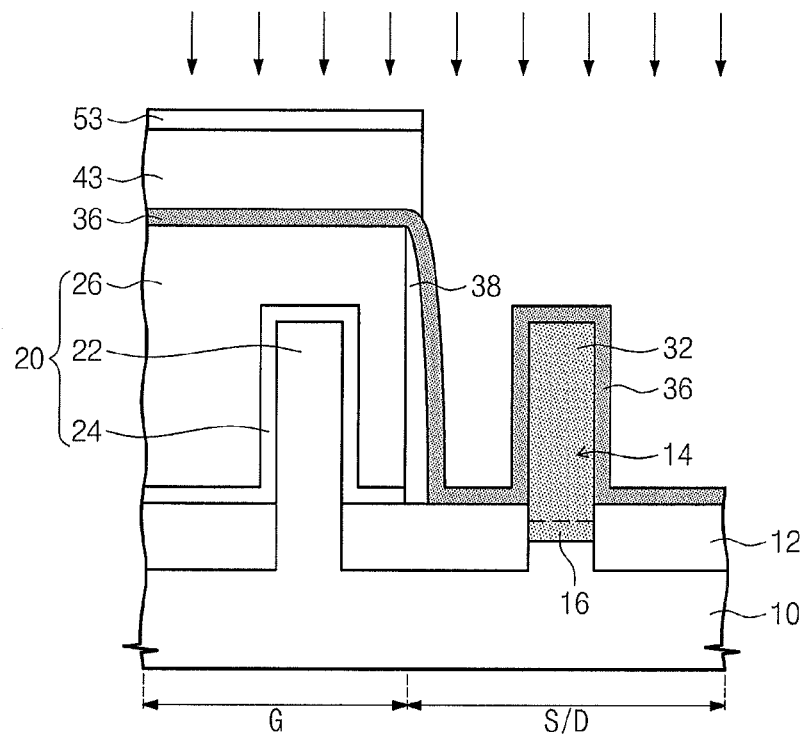

Referring to FIG. 22, impurities may be implanted into the source/drain region S/D of the second fin 32 using the second and first hard mask layers 53 and 43 as an ion implantation mask, thereby forming a source/drain impurity region 16. Impurities may be implanted using an ion implantation process. In some embodiments, the source/drain impurity region 16 may be formed to be deeper than the LDD region 14.

Figure 23:
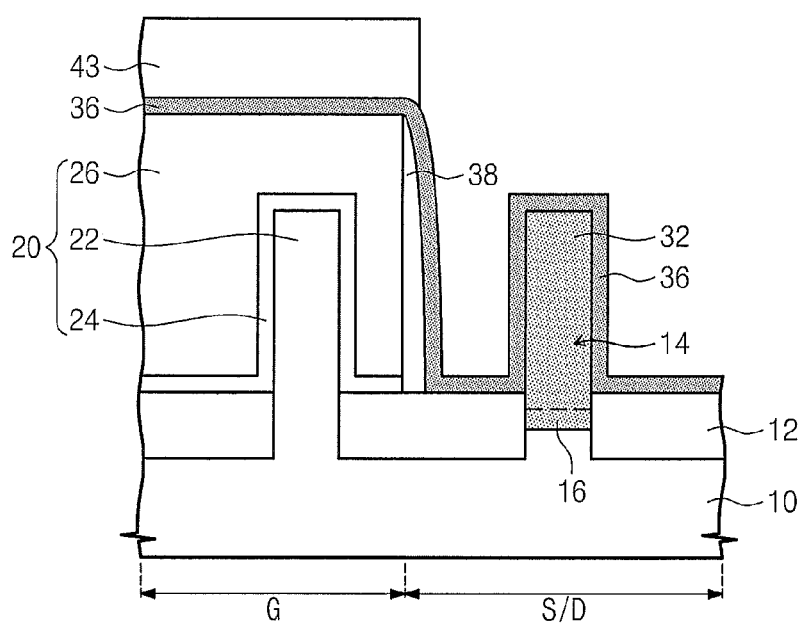

Referring to FIG. 23, the second hard mask layer 53 may be removed. The second hard mask layer 53 may be removed by, for example, a wet etching method using a sulfuric acid solution as an etching solution. The second hard mask layer 53 may have an excellent etch selectivity with respect to the offset spacer 36 and the substrate 10 when the sulfuric acid is used as an etching solution. Thus, the offset spacer 36 may be hardly damaged and a thickness of the offset spacer 36 may not be reduced when the second hard mask layer 53 is removed.

Figure 24:
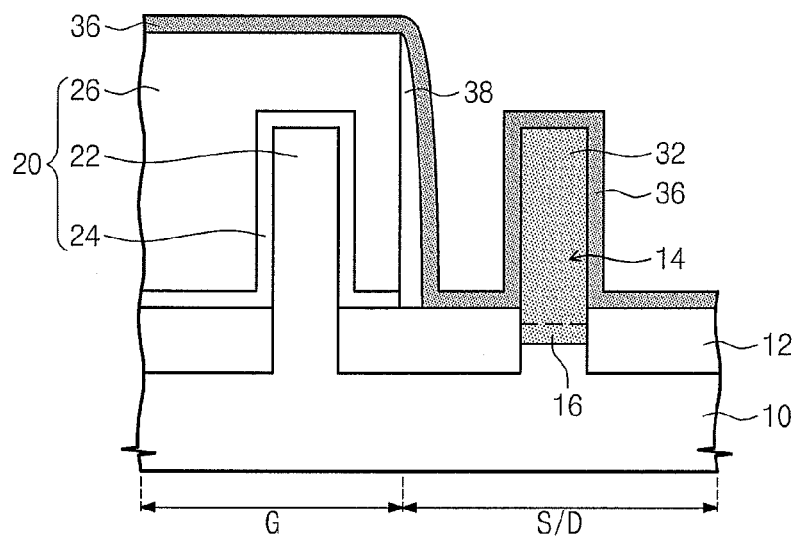

Referring to FIG. 24, the first hard mask layer 43 may be removed. The first hard mask layer 43 may be removed by, for example, an ashing process or a wet etching method. The source/drain impurity region 16 may be formed in the first fin 22 as well as the second fin 32 during the ion implantation process used to form the source/drain impurity region 16 in the second fin 32. The source/drain impurity region 16 may also be formed in other regions of the substrate 10. The second pattern 30 may correspond to an overlapped ion implantation region.

The processes described above with reference to FIGS. 21 and 22 may be performed again to implant impurities into the second fin 32 of the second pattern 30 such that the second pattern 30 may be an overlapped ion implantation region. In other words, another hard mask layer 43 and another hard mask layer 53 may be formed on the offset spacer 36 on the channel region G, and these hard mask layers may then be used as an ion implantation mask during an ion implantation process that implants impurities into the second fin 32. The offset spacer 36 may be used as an ion implantation buffer layer to improve reproducibility of processes of forming the overlapped ion implantation region. Thus, methods of forming a semiconductor device according to some embodiments may increase production yields. The first hard mask layer 43 and the second hard mask layer 53 may be sequentially removed after the overlapped ion implantation region is formed in the manner discussed above.

Figure 25:
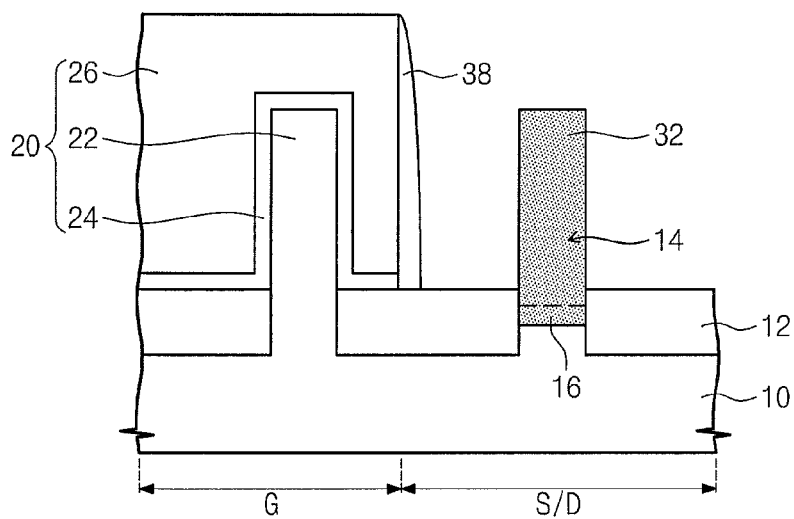

Referring to FIG. 25, the offset spacer 36 may be removed. The offset spacer 36 may be removed by, for example, a dry etching method or a wet etching method.

Figure 26:
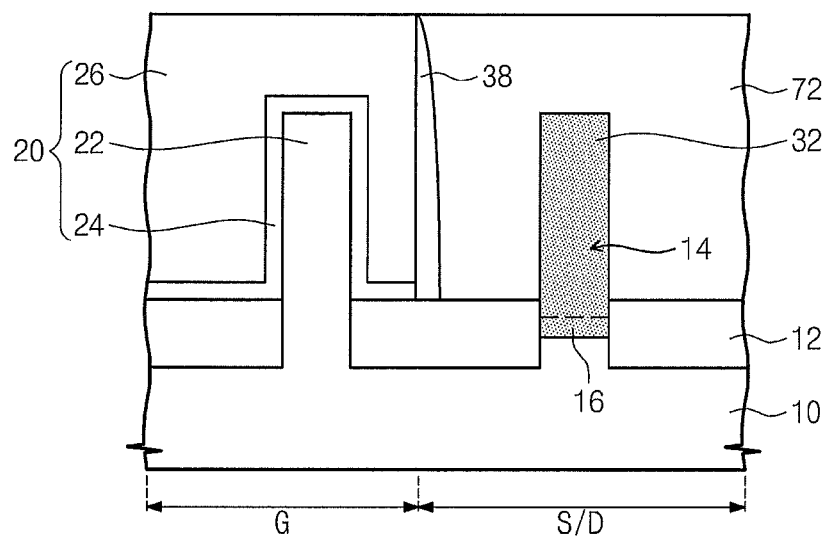

Referring to FIG. 26, an interlayer insulating layer 72 may be formed on the source/drain region S/D. For example, the interlayer insulating layer 72 may include silicon oxide formed by a CVD method.

Figure 27:
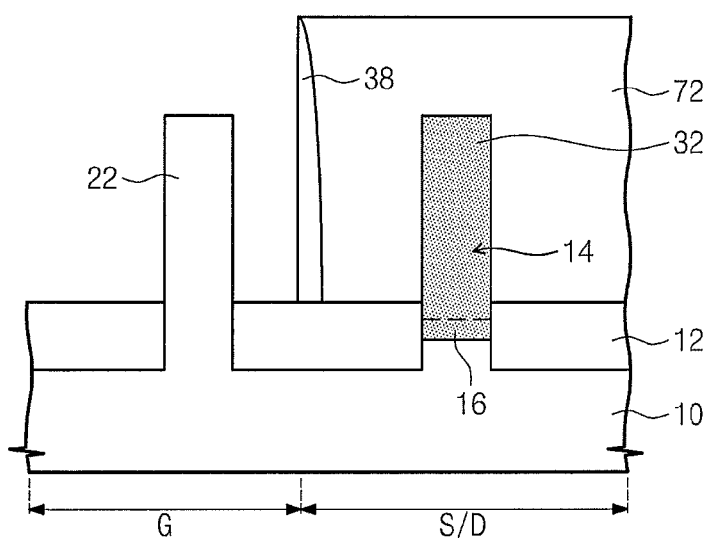

Referring to FIG. 27, the dummy gate electrode layer 26 and the dummy gate insulating layer 24 may be removed. The dummy gate electrode layer 26 and the dummy gate insulating layer 24 may be removed by, for example, a dry etching method or a wet etching method. A wet etching process for removing the dummy gate electrode layer 26 and the dummy gate insulating layer 24 may use an etching solution that may include a LAL solution, hydrofluoric acid, and/or $SF_6$.

Figure 28:
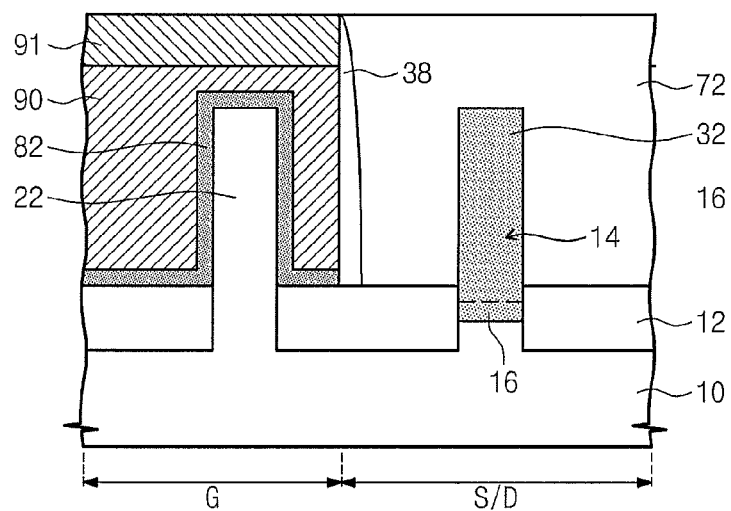

Referring to FIG. 28, a gate insulating layer 82, a lower gate electrode layer 90 and an upper gate electrode layer 91 may be formed on the channel region G. The self-aligned spacer 38 and the interlayer insulating layer 72 may be used as a mold when the gate insulating layer 82, the lower gate electrode layer 90 and the upper gate electrode layer 91 are formed. The gate insulating layer 82 may include, for example, silicon oxide that is formed by a rapid thermal process (RTP). The gate insulating layer 82 may be formed in a space defined by the self-aligned spacer 38. The lower gate electrode layer 90 may be formed on the gate insulating layer 82. The lower gate electrode layer 90 may include, for example, poly-silicon formed by a CVD method. The poly-silicon may be formed on an entire surface of the substrate 10. The upper gate electrode layer 91 may include, for example, a metal formed by a sputtering method or a CVD method. The upper gate electrode layer 91 and the lower gate electrode layer 90 formed on the interlayer insulating layer 72 may be removed. In some embodiments, removing the upper gate electrode layer 91 and the lower gate electrode layer 90 formed on the interlayer insulating layer 72 may be performed by a chemical mechanical polishing (CMP) method.

FIGS. 29 to 47 are cross-sectional views illustrating intermediate structures provided in operations of forming a semiconductor device according to some embodiments of the present inventive concepts.

Figure 29:
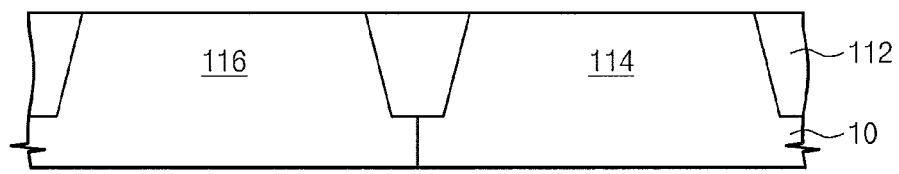
FIGS. 29 to 47 are cross-sectional views illustrating intermediate structures provided in operations of forming a semiconductor device according to some embodiments of the present inventive concepts.

Referring to FIG. 29, a shallow trench-type device isolation layer 112 may be formed in a substrate 10. The device isolation layer 112 may be formed in the substrate 10 between a first active region 114 and a second active region 116. In some embodiments, the first active region 114 may include a first well doped with impurities of a first conductivity type. The second active region 116 may include a second well doped with impurities of a second conductivity type. The device isolation layer 112 may be formed after the first and second wells are formed. The device isolation layer 112 may include, for example, silicon oxide.

Figure 30:
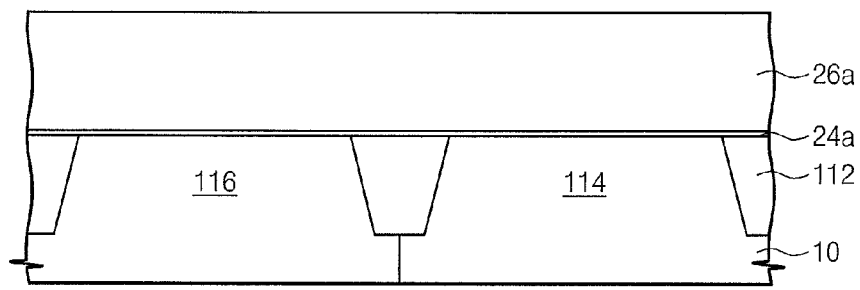

Referring to FIG. 30, a preliminary dummy gate insulating layer 24a and a preliminary dummy gate electrode layer 26a may be sequentially formed on the substrate 10. The preliminary dummy gate insulating layer 24a may include, for example, silicon oxide ($SiO_2$). In some embodiments, the preliminary dummy gate insulating layer 24a may be formed by, for example, a CVD method, an ALD method and/or an RTP method. The preliminary dummy gate electrode layer 26a may include, for example, poly-silicon formed by a CVD method.

Figure 31:
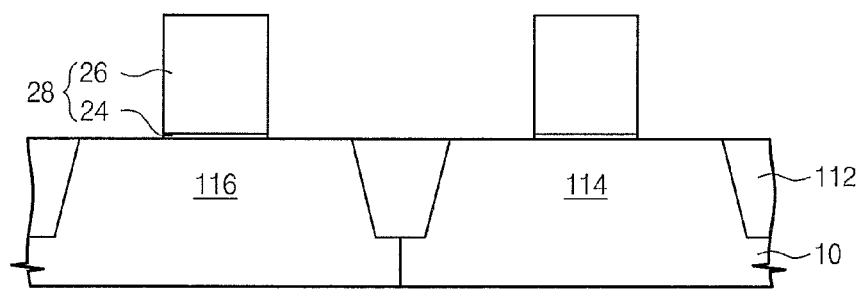

Referring to FIG. 31, the preliminary dummy gate electrode layer 26a and the preliminary dummy gate insulating layer 24a may be patterned to form dummy gate stacks 28 on the first active region 114 and the second active region 116, respectively. Each of the dummy gate stacks 28 may include a dummy gate insulating layer 24 and a dummy gate electrode layer 26.

Figure 32:
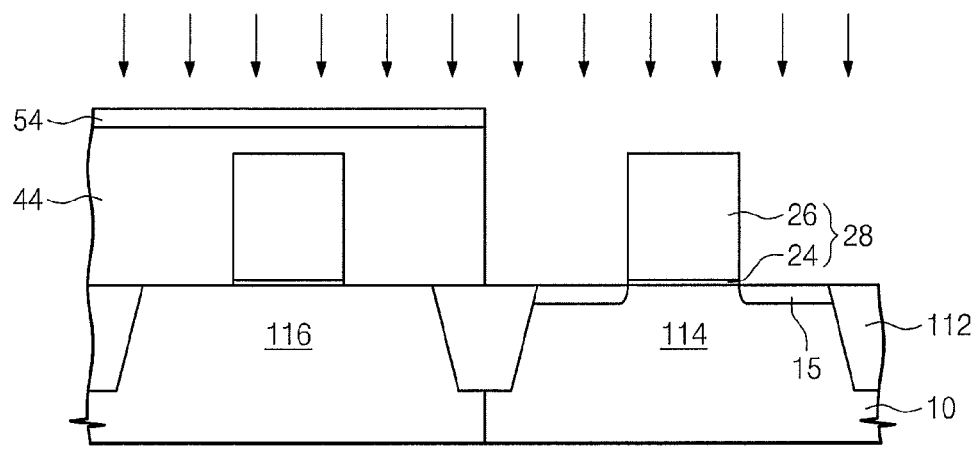

Referring to FIG. 32, a first hard mask layer 44 and a second hard mask layer 54 may be formed on the second active region 116, and first LDD regions 15 may be formed in the first active region 114 using the first and second hard mask layers 44 and 54 and the dummy gate stack 28 on the first active region 114 as an ion implantation mask. The first hard mask layer 44 may include, for example, a carbon layer formed by a spin coating method. The second hard mask layer 54 may include, for example, a BACL formed by a CVD method. For example, the first and second hard mask layers 44 and 54 may be formed by a photolithography process and an etching process. The first LDD region 15 may be doped with impurities of the second conductivity type.

Figure 33:
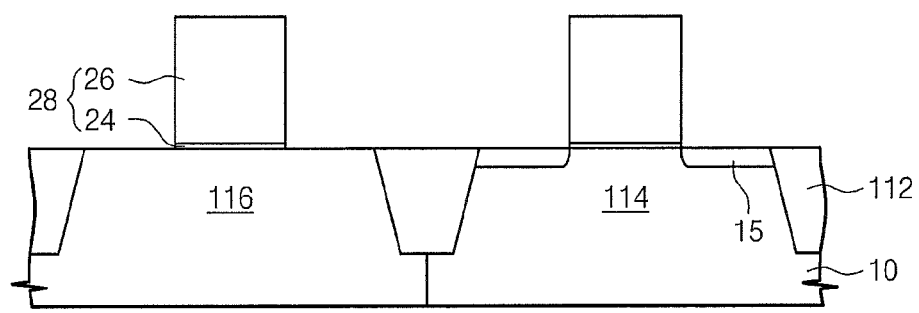

Referring to FIG. 33, the second hard mask layer 54 and the first hard mask layer 44 may be sequentially removed. The second hard mask layer 54 may be removed by, for example, a wet etching process using a sulfuric acid solution. Each of the dummy gate electrode layer 26, the dummy gate insulating layer 24 and the substrate 10 may have an etch selectivity with respect to the second hard mask layer 54 such that the dummy gate electrode layer 26, the dummy gate insulating layer 24 and the substrate 10 may be hardly damaged (e.g., etched) when the second hard mask layer 54 is removed. The first hard mask layer 44 may be removed by, for example, an ashing process.

Figure 34:
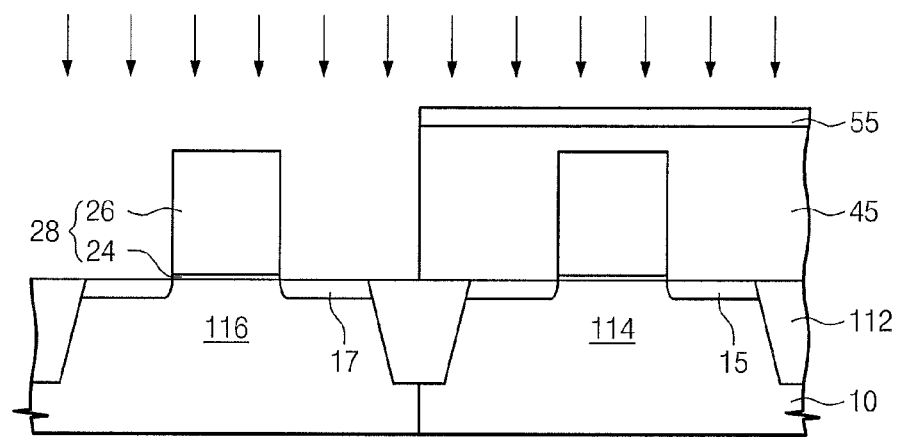

Referring to FIG. 34, a first hard mask layer 45 and a second hard mask layer 55 may be formed on the first active region 114, and second LDD regions 17 may be formed in the second active region 116 using the first and second hard mask layer 45 and 55 and the dummy gate stack 28 of the second active region 116 as an ion implantation mask. The second LDD regions 17 may be doped with impurities of the first conductivity type. The first hard mask layer 45 may include, for example, a carbon layer formed by a spin coating method. The second hard mask layer 55 may include, for example, a BACL formed by a CVD method.

Figure 35:
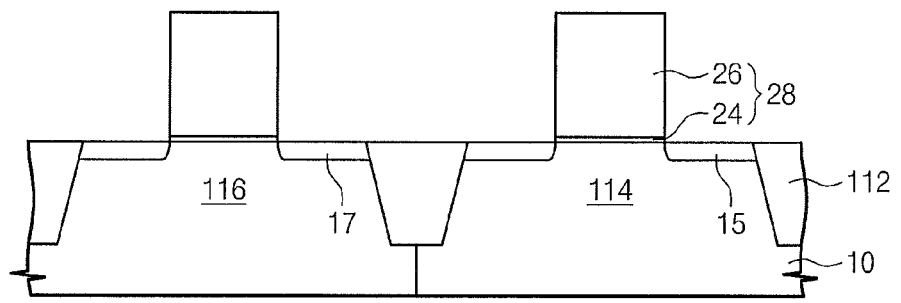

Referring to FIG. 35, the second hard mask layer 55 and the first hard mask layer 45 may be sequentially removed. The second hard mask layer 55 may be removed by, for example, a wet etching process using a sulfuric acid solution. The first hard mask layer 45 may be removed by, for example, an ashing process. Each of the dummy gate stack 28 and the substrate 10 may have an etch selectivity with respect to the second hard mask layer 55 such that the dummy gate stack 28 and the substrate 10 may be hardly damaged when the second hard mask layer 55 is removed.

Figure 36:
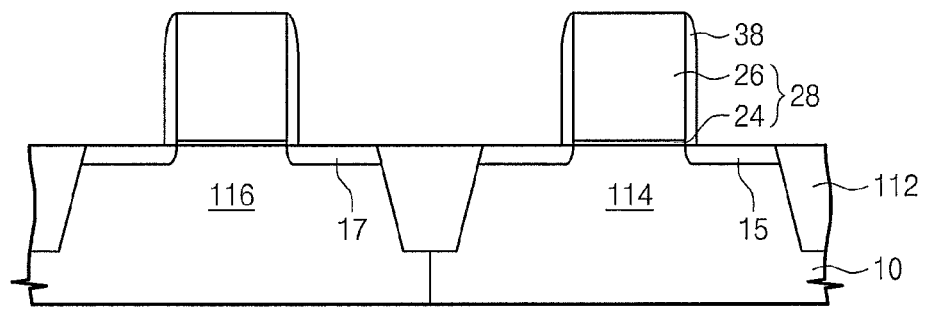

Referring to FIG. 36, self-aligned spacers 38 may be formed on sidewalls of the dummy gate stacks 28. The self-aligned spacers 38 may be formed by a self-aligning method. In some embodiments, the self-aligned spacers 38 may include, for example, silicon nitride formed by a CVD method.

Figure 37:
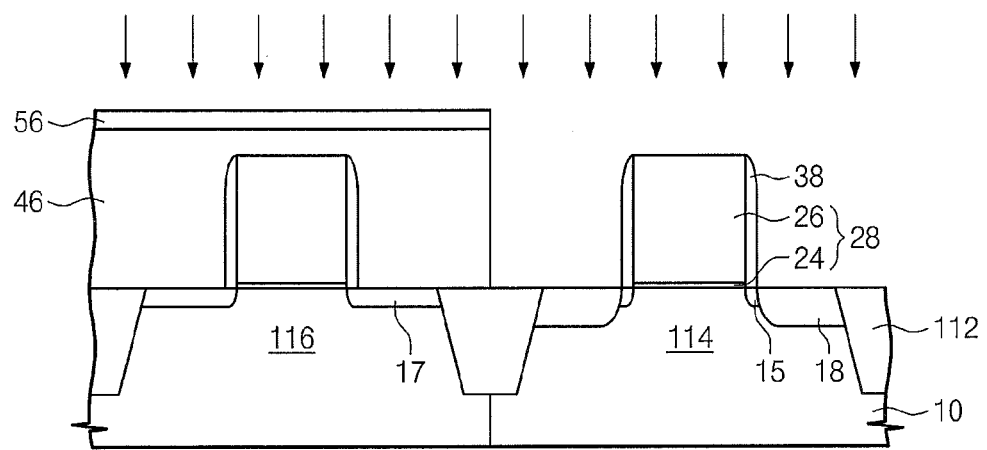

Referring to FIG. 37, a first hard mask layer 46 and a second hard mask layer 56 may be formed on the second active region 116, and first source/drain impurity regions 18 may be formed in the substrate 10 of the first active region 114. The first hard mask layer 46 may include, for example, a carbon layer formed by a spin coating method. The second hard mask layer 56 may include, for example, a BACL formed by a CVD method. For example, the first and second hard mask layers 46 and 56 may be formed on the second active region 116 by a photolithography process and an etching process. The first source/drain impurity regions 18 may be formed by an ion implantation process using impurities of the second conductivity type. The first and second hard mask layers 46 and 56 may be used as an ion implantation mask during the ion implantation process. Additionally, the dummy gate stack 28 and the self-aligned spacers 38 on the first active region 114 may also be used as an ion implantation mask during the ion implantation process. It will be understood that the self-aligned spacers 38 on the first active region 115 may be considered as the second pattern 30, which is described with reference to FIGS. 2 through 8. The first source/drain impurity regions 18 may be formed to be deeper than the first LDDL regions 15.

Figure 38:
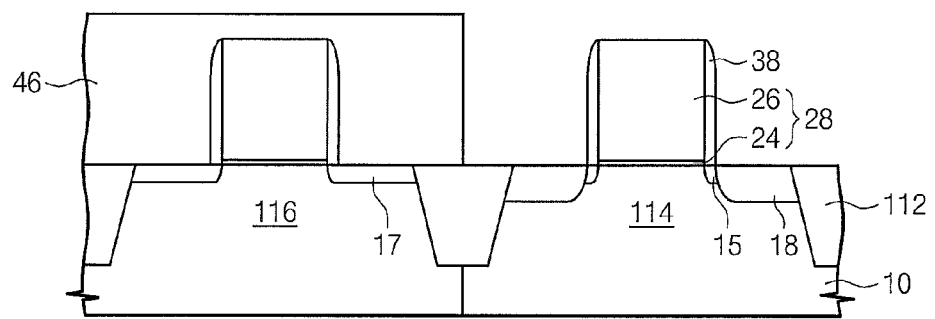

Referring to FIG. 38, the second hard mask layer 56 may be removed. The second hard mask layer 56 may be removed by, for example, a wet etching process using a sulfuric acid solution. The self-aligned spacers 38 may have an etch selectivity with respect to the second hard mask layer 56 when the second hard mask layer 56 is removed by the sulfuric acid solution. Thus, the self-aligned spacers 38 may be hardly damaged or removed. Accordingly, methods of forming a semiconductor device according to some embodiments may increase production yields.

Figure 39:
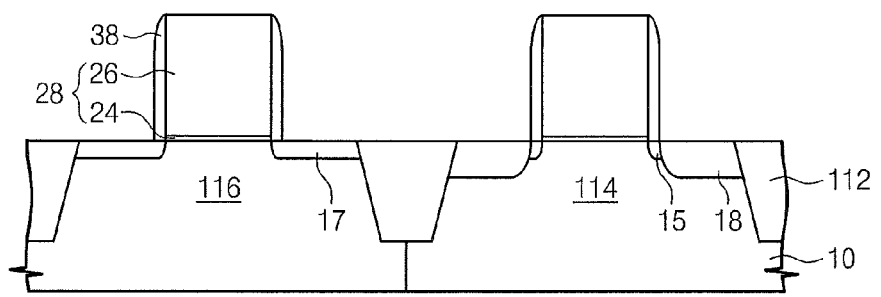

Referring to FIG. 39, the first hard mask layer 46 may be removed. The first hard mask layer 46 may be removed by, for example, an ashing process or a wet etching method.

Figure 40:
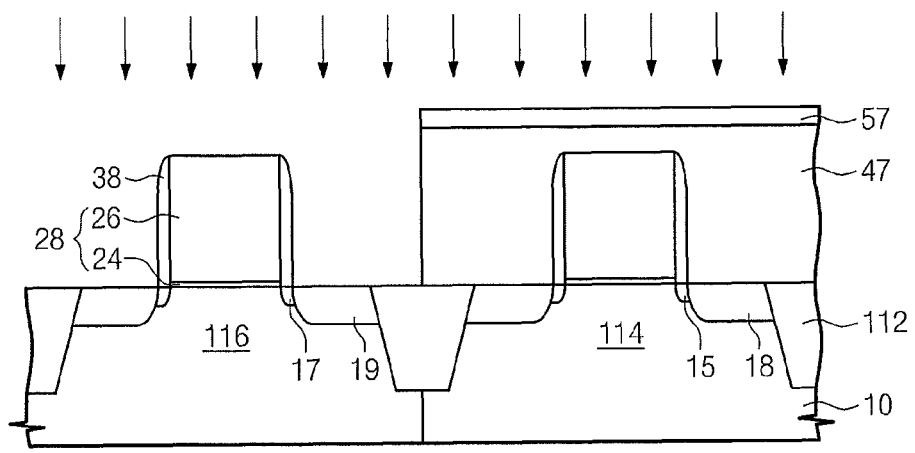

Referring to FIG. 40, a first hard mask layer 47 and a second hard mask layer 57 may be formed on the first active region 114, and second source/drain impurity regions 19 may be formed in the substrate 10 of the second active region 116. The second source/drain impurity regions 19 may be formed by, for example, an ion implantation process using impurities of the first conductivity type. The first and second hard mask layers 47 and 57, the dummy gate stack 28 and the self-aligned spacers 38 on the second active region 116 may be used as an ion implantation mask during the ion implantation process implanting the impurities of the first conductivity type. The first hard mask layer 47 may include, for example, a carbon layer formed by a spin coating method. The second hard mask layer 57 may include, for example, a BACL formed by a CVD method.

Figure 41:
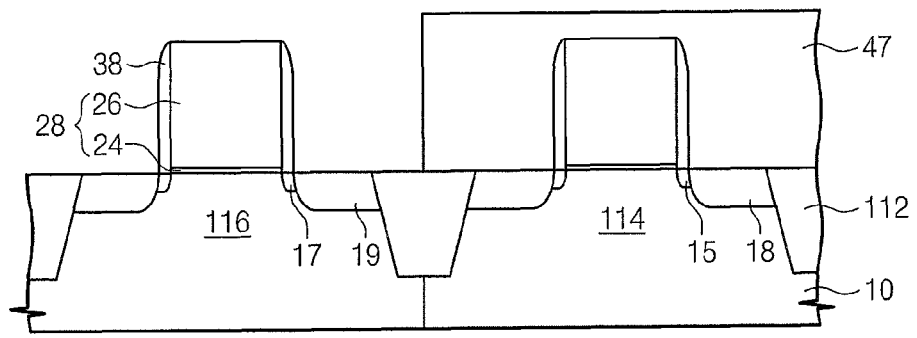

Referring to FIG. 41, the second hard mask layer 57 may be removed. The second hard mask layer 57 may be removed by, for example, a wet etching process using a sulfuric acid solution. The self-aligned spacers 38 on the second active region 116 may have an etch selectivity with respect to the second hard mask layer 57 when the second hard mask layer 57 is removed by the sulfuric acid solution. Thus, the self-aligned spacers 38 of the second active region 116 may be hardly damaged or removed. Thus, a method of forming a semiconductor device according to some embodiments may increase production yields.

Figure 42:
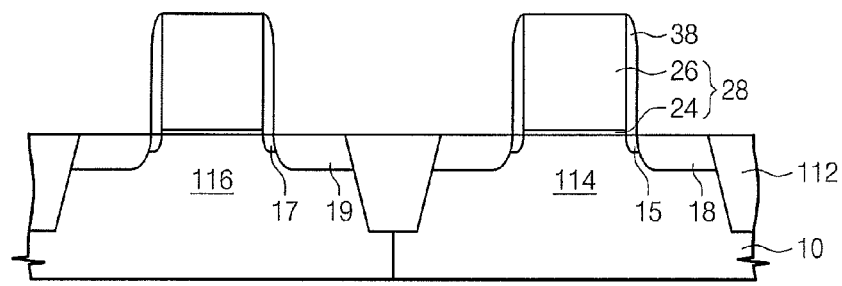

Referring to FIG. 42, the first hard mask layer 47 may be removed. The first hard mask layer 47 may be removed by, for example, an ashing process or a wet etching method.

Figure 43:
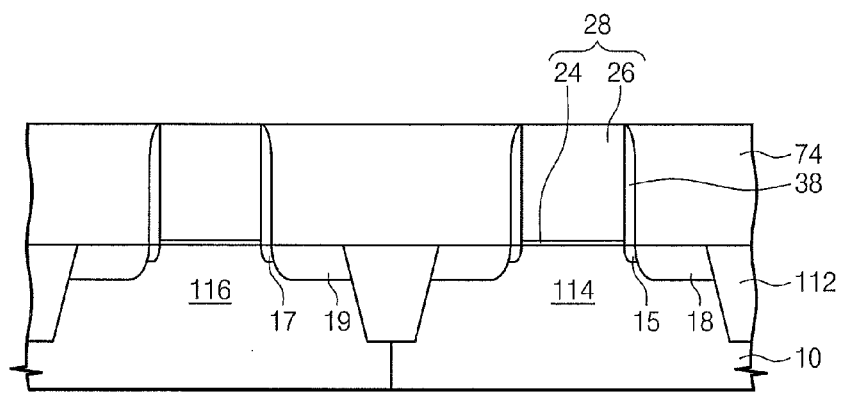

Referring to FIG. 43, an interlayer insulating layer 74 may be formed on the device isolation layer 112, the first source/drain impurity regions 18 and the second source/drain impurity region 19. The interlayer insulating layer 74 may include, for example, silicon oxide. The interlayer insulating layer 74 may be formed by a low-pressure CVD (LPCVD) method or a plasma-enhanced CVD (PECVD) method. The interlayer insulating layer 74 may be planarized to expose top surfaces of the dummy gate stacks 28. The interlayer insulating layer 74 may be planarized by a CMP process or an etch-back process.

Figure 44:
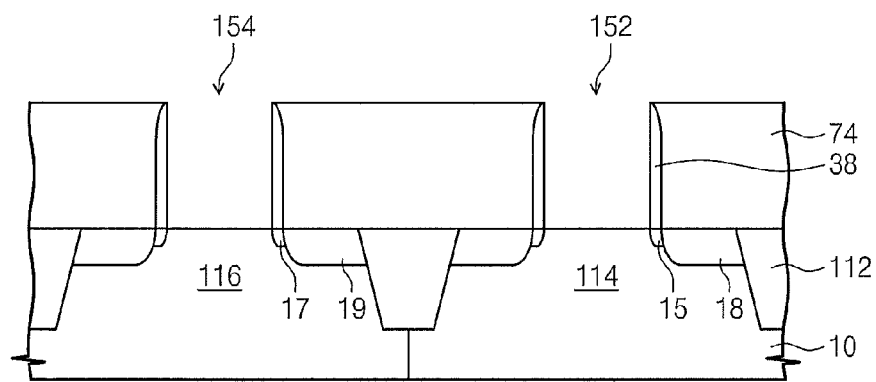

Referring to FIG. 44, the dummy gate stacks 28 on the first and second active regions 114 and 116 may be removed to form a first trench 152 and a second trench 154. The dummy gate stacks 28 may be removed by a wet etching method or a dry etching method. The interlayer insulating layer 74 and the self-aligned spacers 38 may be used as an etch mask during removing the dummy gate stacks 28.

Figure 45:
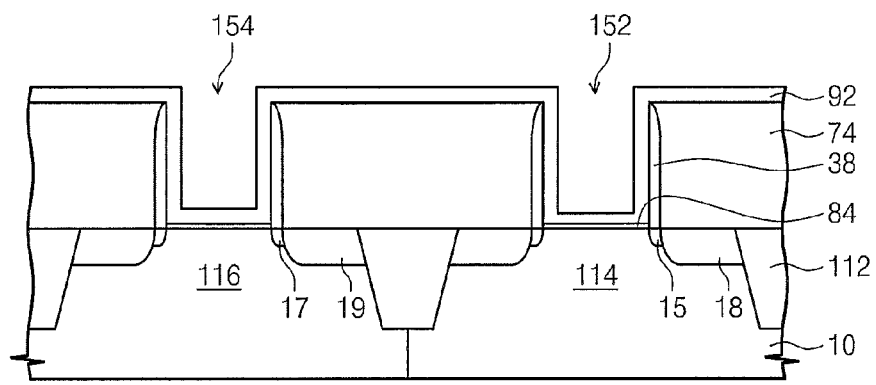

Referring to FIG. 45, a gate insulating layer 84 and a lower gate electrode layer 92 may be formed on the substrate 10 including the first and second trenches 152 and 154. The gate insulating layer 84 and the lower gate electrode layer 92 may be formed on the entire surface of the substrate 10. The gate insulating layer 84 may include, for example, silicon oxide formed by a RTP method. The lower gate electrode layer 92 may include, for example, poly-silicon.

Figure 46:
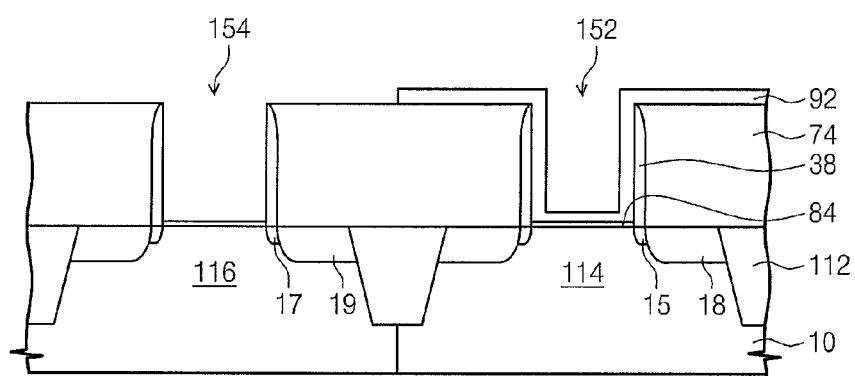

Referring to FIG. 46, the lower gate electrode layer 92 on the second active region 116 may be removed. For example, the lower gate electrode layer 92 may be removed by a photolithography process and an etching process. The lower gate electrode layer 92 may remain in the first trench 152.

Figure 47:
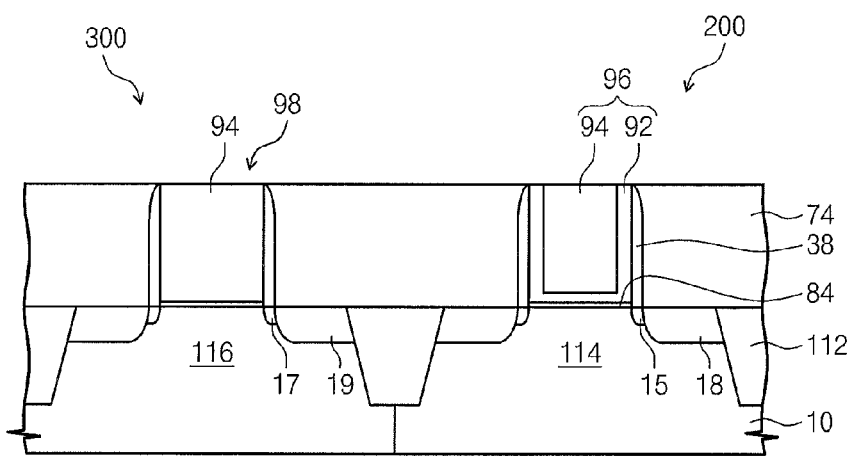

Referring to FIG. 47, an upper gate electrode layer 94 may be formed in the first trench 152 and the second trench 154. The upper gate electrode layer 94 may include, for example, a metal formed by a sputtering method or a CVD method. Forming the upper gate electrode layer 94 may include a planarization process, for example, a CMP method. The lower and upper gate electrode layers 92 and 94 formed on the interlayer insulating layer 74 may be removed. A first gate electrode 96 may include a portion of the lower gate electrode layer 92 and a portion of the upper gate electrode layer 94. A first MOS transistor 200 may include the first active region 114 and the first gate electrode 96. A second MOS transistor 300 may include the second active region 116 and a second gate electrode 98. For example, the first MOS transistor 200 may be a PMOS transistor and the second MOS transistor 300 may be an NMOS transistor.

Methods of forming a semiconductor device according to some embodiments of the present inventive concepts may include performing a first process using a spacer and first and second hard mask layers as a mask. The first and second hard mask layers may have an etch selectivity with respect to the spacer. Accordingly, the spacer may not be damaged or etched and may thus maintain its thickness when the first and second hard mask layers are removed. The methods may further include performing a second process using the spacer as a mask after removing the first and second hard mask layers. Since the spacer may not be substantially damaged or etched before performing the second process, reproducibility of the second process may be improved. Therefore, the methods may increase production yields.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method for manufacturing a semiconductor device, the method comprising;
   forming a first pattern and a second pattern on a substrate;
   forming a first hard mask layer and a second hard mask layer on the first pattern;
   performing a first process on the second pattern that is exposed by the first and second hard mask layers; and
   removing the second hard mask layer by an etching process,
   wherein a ratio of etch rates between the second hard mask layer and the second pattern during the etching process is in a range of about 100:1 to about 10,000:1.

2. The method of claim 1, wherein the first hard mask layer includes a carbon containing layer formed by a spin coating method.

3. The method of claim 2, wherein the second hard mask layer includes a carbon containing layer doped with impurities, and the first hard mask layer is disposed between the substrate and the second hard mask layer.

4. The method of claim 3, wherein the impurities include boron, gallium, phosphorus and/or arsenic.

5. The method of claim 3, wherein the second hard mask layer is an amorphous carbon layer formed by a chemical vapor deposition (CVD) process or an atomic layer deposition (ALD) process.

6. The method of claim 1, wherein the etching process is a wet etching process using an etching solution that includes sulfuric acid.

7. The method of claim 1, wherein the second pattern comprises a spacer on the substrate, and the spacer includes silicon nitride.

8. The method of claim 1, further comprising forming a third hard mask layer on the second hard mask layer, wherein the third hard mask layer includes a material different from the second hard mask layer.

9. The method of claim 8, wherein the third hard mask layer includes silicon oxide.

10. The method of claim 9, further comprising:
    patterning the second hard mask layer using the third hard mask layer as an etch mask; and
    removing the third hard mask layer by a wet etching process,
    wherein the third hard mask layer is removed using a LAL solution, and a ratio of etch rates between the third hard mask layer and the second hard mask layer during the wet etching process is in a range of about 1:1 to about 100:1.

11. The method of claim 1, further comprising:
    removing the first hard mask layer by a wet etching process or an ashing process after removing the second hard mask layer.

12. A method of forming a semiconductor device, the method comprising:
    forming an insulating layer comprising silicon on a substrate;
    sequentially forming a first hard mask layer and a second hard mask layer on the substrate, wherein:
    the first hard mask layer comprises carbon,
    the second hard mask layer comprises carbon and impurities, and
    the first and second hard mask layers expose at least a portion of the insulating layer; and
    performing an etching process to selectively remove the second hard mask layer with respect to the insulating layer.

13. The method of claim 12, wherein a ratio of etch rates between the second hard mask layer and the insulating layer during the etching process is in a range of about 100:1 to about 10,000:1.

14. The method of claim 13, wherein the impurities in the second hard mask layer comprise boron, gallium, phosphorus and/or arsenic.

15. The method of claim 14, wherein the second hard mask layer is an amorphous carbon layer formed by a chemical vapor deposition (CVD) process or an atomic layer deposition (ALD) process.

16. The method of claim 15, wherein performing the etching process comprises performing a wet etching process using an etchant comprising sulfuric acid.

17. The method of claim 16, wherein the first hard mask layer is a carbon containing layer formed by a spin coating process.

18. The method of claim 17, wherein the insulating layer is a silicon nitride layer or a silicon oxynitride layer.

19. The method of claim 18, further comprising performing an ion implantation process using the first and second hard mask layers as an ion implantation mask.

20. The method of claim 17, wherein the insulating layer has a substantially equivalent thickness before and after performing the etching process.

* * * * *